US005453749A

United States Patent [19]

Morita

[11] Patent Number: 5,453,749

[45] Date of Patent: Sep. 26, 1995

[54] SENSITIVITY MEASURING APPARATUS FOR USE WITH A FIRE DETECTOR

[75] Inventor: Toshikazu Morita, Tokyo, Japan

[73] Assignee: Nohmi Bosai, Ltd., Tokyo, Japan

[21] Appl. No.: 67,147

[22] Filed: May 26, 1993

[30] Foreign Application Priority Data

May 28, 1992 [JP] Japan .................................... 4-162028

[51] Int. Cl.[6] ............................ H03M 1/10; G08B 29/20

[52] U.S. Cl. ...................................... 341/118; 364/571.01

[58] Field of Search .................................... 364/550, 553, 364/571.01, 571.03; 341/118, 120

[56] References Cited

U.S. PATENT DOCUMENTS

| | | | |
|---|---|---|---|
| 3,866,195 | 2/1975 | Ried, Jr. | 340/629 |
| 4,097,850 | 6/1978 | Conforti | 340/514 |
| 4,193,069 | 3/1980 | Cooper et al. | 340/630 |
| 4,420,746 | 12/1983 | Malinowski | 340/630 |
| 4,524,351 | 6/1985 | Kimura et al. | 340/629 |
| 4,665,390 | 5/1987 | Dern et al. | 364/551 |
| 4,825,196 | 4/1989 | Morita | 340/531 |
| 4,827,247 | 5/1989 | Giffone | 340/630 |
| 4,829,449 | 5/1989 | Polesnak | 364/571.02 |
| 4,977,527 | 12/1990 | Shaw et al. | 364/571.03 |

*Primary Examiner*—Howard L. Williams

*Attorney, Agent, or Firm*—Wenderoth, Lind & Ponack

[57] ABSTRACT

A sensitivity measuring apparatus for use with a fire detector comprising includes sensitivity measuring portions, a calibrating signal generator, and a calibrator. The sensitivity measuring apparatus also includes a type identifier for the type of the fire detector on the basis of the output signal from the fire detector. The apparatus thus needs no manpower during its adjustment procedure to regulate the tolerance of the internal circuit. The apparatus also eliminates a source of erroneous measurements in the course of sensitivity measurement of the fire detector.

30 Claims, 18 Drawing Sheets

FIG. 16

CONTENT OF ROM 22

| OUTPUT OF FIRE DETECTOR SEi AT M1 (V) [CORRESPONDING SENSITIVITY] | | A/D CONVERTED VALUE (ADDRESS OF ROM 22) [DECIMAL] | | DATA IN ROM 22 [DECIMAL] | | D/A CONVERTED VALUE (V) [READING ON VOLTMETER MV] |
|---|---|---|---|---|---|---|
| 0.00 | [ - ] | 00000000 | [ 0 ] | 11111111 | [255] | — |
| ⋮ | ⋮ | ⋮ | ⋮ | ⋮ | ⋮ | ⋮ |
| 0.98 | [4.88] | 00110001 | [ 49] | 01111010 | [122] | 4.88 |
| 1.00 | [4.80] | 00110010 | [ 50] | 01111100 | [120] | 4.80 |
| ⋮ | ⋮ | ⋮ | ⋮ | ⋮ | ⋮ | ⋮ |
| 1.98 | [2.04] | 01100011 | [ 99] | 00110011 | [ 51] | 2.04 |
| 2.00 | [2.00] | 01100100 | [100] | 00110100 | [ 50] | 2.00 |
| ⋮ | ⋮ | ⋮ | ⋮ | ⋮ | ⋮ | ⋮ |
| 3.00 | [0.60] | 10010110 | [150] | 00001111 | [ 15] | 0.60 |
| ⋮ | ⋮ | ⋮ | ⋮ | ⋮ | ⋮ | ⋮ |
| 4.00 | [0.00] | 11001000 | [200] | 00000000 | [ 0 ] | 0.00 |
| ⋮ | ⋮ | ⋮ | ⋮ | ⋮ | ⋮ | ⋮ |
| 5.10 | [0.00] | 11111111 | [255] | 00000000 | [ 0 ] | 0.00 |

SENSITIVITY MEASURING APPARATUS FOR USE WITH A FIRE DETECTOR

BACKGROUND OF THE INVENTION

1. Field of the Invention

The present invention is directed to a sensitivity measuring apparatus for measuring the sensitivity of a fire detector in a fire alarm system.

2. Description of the Related Art

The measurement of the sensitivity of a smoke type fire detector has been conventionally effected as follows: the fire detector is mounted on the ceiling of a room with its output terminal provided externally in an easily accessible manner. With the fire sensor left mounted, an output signal is received from the output terminal to be used for sensitivity measurement. Since, in this case, the dismounting of the fire detector from the ceiling or the like is not needed, the overall time required for sensitivity measurement is shortened.

The output signal from a smoke type fire detector is typically an impedance transformed chamber voltage in an ionization type fire detector. Another kind of output signal is typically a pulsed voltage signal in a photoelectric type fire detector (scattered light type fire detector) which comprises a detector chamber, a light emitting element and a light receiving element. In the photoelectric type fire detector, the light receiving element receives scattered light of the light output continually emitted from the light emitting element. An amplifier amplifies the output signal from the light receiving element to output pulsed voltage signals.

The output signal from the smoke fire detector varies with the smoke density. Even under a constant smoke density, the strength of the output signal varies due to dirt or the like deposited on the detector itself; that is, the sensitivity of the detector still varies. In the measurement of the sensitivity of the fire detector, a sensitivity measuring apparatus receives the output of the fire detector to display the output signal, for example, an output voltage while the smoke density is kept constant (normally the smoke density is kept at almost 0%/m). A reference table which lists sensitivity values of the fire detector versus the output voltages is prepared beforehand. Based on the value of the output voltage displayed by the sensitivity measuring apparatus, the corresponding sensitivity may be found on the reference table. The sensitivity of the fire detector is measured in this way.

The sensitivity measuring apparatus typically comprises an amplifier for processing the output signal of the fire detector, an analog signal processing circuit including a sample and hold circuit and the like, and an A/D converter for converting processed analog signals into digital signals. When the measurement results are output in the form of analog signals, a D/A converter for converting the digital signals into analog signals may be further required.

Since many buildings are already equipped with fire detectors and the buildings lie scattered in broad areas, a great number of fire detectors are accordingly produced and supplied. To maintain accuracy in measurements in the sensitivity measuring apparatus, the internal circuitry in each apparatus should be individually adjusted to keep it to within acceptable tolerance.

The related tolerance values are, for example, the amplification tolerance of an amplifier, the DC offset voltage tolerance of a sample hold circuit, and the reference voltage tolerances of an A/D converter and a D/A converter. Conventionally, each circuit has been adjusted to be within a required tolerance range by adjusting its built-in variable resistors. This adjustment is performed not only at the production of each sensitivity measuring apparatus but also every predetermined period of time to compensate for aging effects. This adjustment requires a great deal of manpower and time.

By the type of the output signal, fire detectors may be divided into several categories: for example, ionization type fire detectors, photoelectric type fire detectors, and other types of fire detectors. The sensitivity measuring apparatus thus contains several measuring circuits, each corresponding to a particular type of the output signal of the fire detector to be measured. In making measurements, an inspector needs to switch from one circuit to another in the sensitivity measuring apparatus to match the output signal type of the fire detector to be measured.

The inspector may judge the output signal type of the fire detector to be measured from the appearance of the fire detector or from the model name and other information on the label which the fire detector carries. Even if fire detectors may look similar, they may provide actually different types of output signals. After a long time of use, the content of the label which a fire detector carries may be illegible. In such a case, there is a possibility that the inspector may select an incorrect circuit.

If this happens, a large magnitude of error may be introduced into sensitivity measurement results of the fire detector. The inspector may judge a fire detector with proper sensitivity to be faulty. Conversely, the inspector may judge a fire detector with poor sensitivity to be normal.

Furthermore, when an inspector has completed sensitivity measurements of a fire detector using a sensitivity measuring apparatus, he may forget turning off power for the apparatus. If he forgets, internal batteries discharge, and the apparatus can not be used again.

To avoid such an inadvertent situation, there is a way in which power is forcibly turned off only when a predetermined period of time has elapsed since the sensitivity measuring apparatus was switched on. In this arrangement, however, the sensitivity measuring apparatus might be switched off even in the middle of measurement operation when the predetermined time has been elapsed, although the batteries are prevented from discharging attributable to an inspector's inadvertent omission of switching off operation. The measurement is thus interrupted, and the inspector needs to switch on again. This procedure is complex.

In the course of sensitivity measurement, if an external noise is received by the fire detector and is superimposed onto the detector's own output signal, the sensitivity measuring apparatus receives the sum of the external noise and the fire detector output signal, and performs an erroneous sensitivity judgment. If an external noise is directly received by the sensitivity measuring apparatus, it also performs an erroneous sensitivity judgment.

SUMMARY OF THE INVENTION

It is an object of the present invention to provide a sensitivity measuring apparatus for use with a fire detector, wherein the sensitivity measuring apparatus needs no manpower in adjustment procedure to regulate the tolerance of the internal circuit of the sensitivity measuring apparatus.

It is a further object of the present invention to provide a sensitivity measuring apparatus for use with a fire detector, wherein the sensitivity measuring apparatus eliminates a source of erroneous measurements in the course of sensitivity measurement of the fire detector.

It is another object of the present invention to provide a sensitivity measuring apparatus for use with a fire detector, wherein the sensitivity measuring apparatus features a relatively simple power switch procedure with no possibility of useless discharge of a built-in battery in the event of a forgotten switching off operation.

It is still another object of the present invention to provide a sensitivity measuring apparatus for use with a fire detector, wherein the sensitivity measuring apparatus is free from erroneous measurements even in the presence of an external noise, which may be superimposed on the output of the fire detector.

A sensitivity measuring apparatus for use with a fire detector according to the first aspect of the present invention comprises: a sensitivity measuring means for receiving the output signal from the fire detector to measure the sensitivity of the fire detector; a reference signal generating means for generating a reference signal for calibration and a calibrating means for calibrating the sensitivity measuring apparatus on the basis of the reference signal generated from the reference signal generating means.

A sensitivity measuring apparatus for use with a fire detector according to the second aspect of the present invention comprises: a sensitivity measuring means for receiving the output signal from the fire detector to measure the sensitivity of the fire detector and a type identifying means for identifying the type of fire detector on the basis of the output signal of the fire detector.

A sensitivity measuring apparatus for use with a fire detector according to the third aspect of the present invention comprises: a signal detecting means for detecting the output signal from the fire detector; a sensitivity measuring means for measuring the sensitivity of the fire detector on the basis of the signal detected by the signal detecting means; a clock signal supplying means for supplying a clock signal to the sensitivity measuring means, and a supply stopping means for stopping the supplying of the clock signal from the clock signal supplying means to the sensitivity measuring means if the signal detecting means detects no output signal from the fire detector during a predetermined time period.

A sensitivity measuring apparatus for use with a fire detector according to the fourth aspect of the present invention comprises: a signal detecting means for detecting the output signal from the fire detector; a sensitivity measuring means for measuring the sensitivity of the fire detector on the basis of the signal detected by the signal detecting means; a power supply means for supplying power to the sensitivity measuring means, and a supply stopping means for stopping the supplying of power from the power supply means to the sensitivity measuring means when the signal detecting means detects no output signal from the fire detector during a predetermined time period.

A sensitivity measuring apparatus for use with a fire detector according to the fifth aspect of the present invention comprises: a measuring means for measuring the output signal from the fire detector to obtain measured data every predetermined time period; an extracting means which extracts a second predetermined amount of measured data from among a group of data consisting of a first predetermined amount of measured data which is greater than the second predetermined amount of measured data, in the order in which extracting priority is placed on smaller mutual differences; a mean-value calculating means for calculating a mean value of the measured data extracted by the extracting means, and a sensitivity determining means for determining the sensitivity of the fire detector on the basis of the average value calculated by the average calculating means.

BRIEF DESCRIPTION OF THE DRAWINGS

FIG. 16 is a reference table listing the output signal value of the fire detector versus sensitivity value.

DESCRIPTION OF THE PREFERRED EMBODIMENTS

Figure 1:
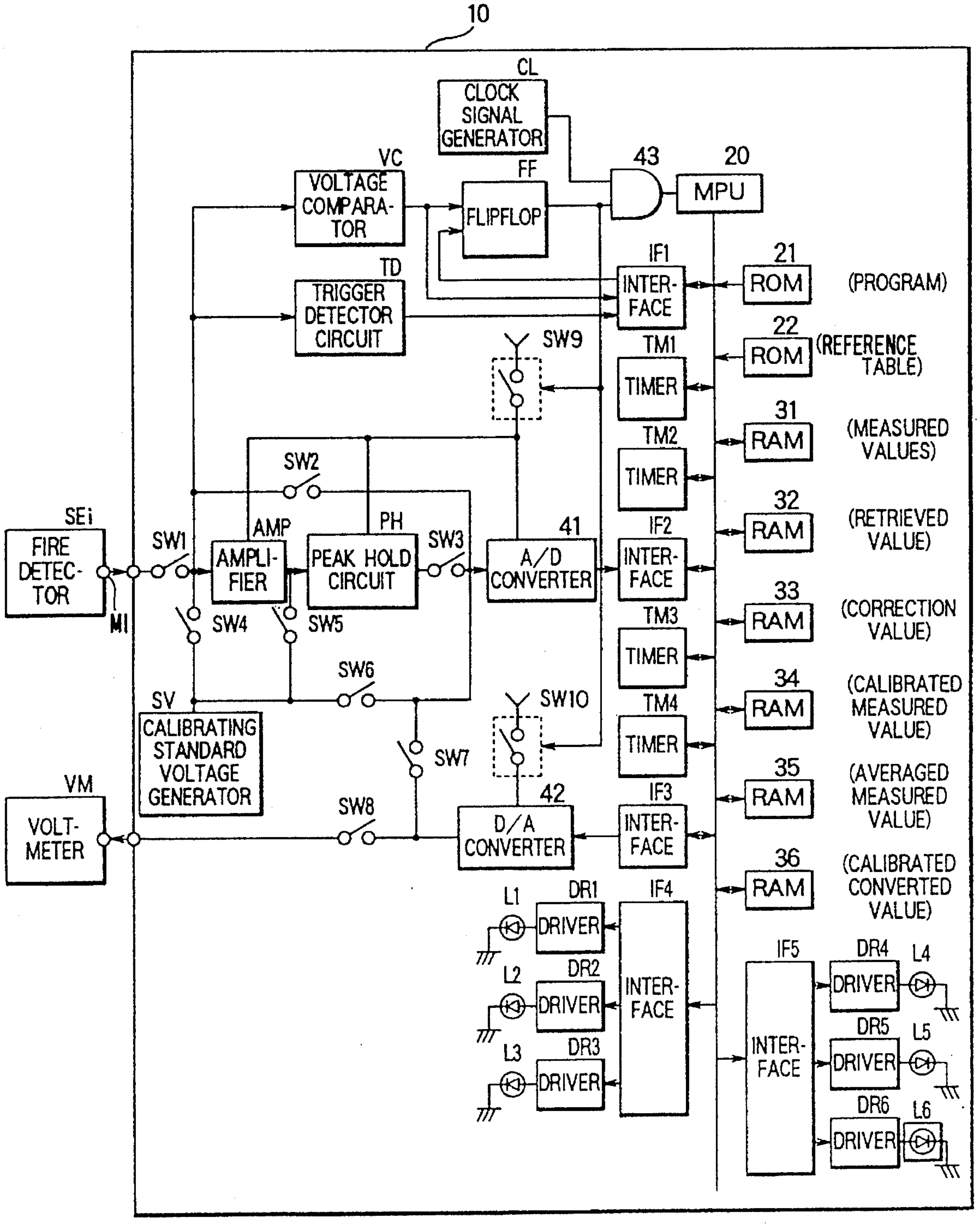
FIG. 1 is a block diagram of an embodiment of the present invention.

In FIG. 1, the sensitivity measuring apparatus 10 according to an embodiment of the present invention receives the output signal of an ionization type smoke detector SEi appearing at a test point M1 which is an output terminal of the detector SEi, and outputs the sensitivity value corresponding to this output signal.

The sensitivity measuring apparatus 10 comprises a MPU (microprocessor unit) 20 which controls the entire operation of the sensitivity measuring apparatus 10, ROMs 21 and 22, RAMs 31, 32, 33, 34, 35 and 36, an A/D converter 41 for converting an analog signal into a digital signal, a D/A converter 42 for converting a digital signal into an analog signal, an AND gate 43, timers TM1, TM2, TM3 and TM4, interfaces IF1, IF2, IF3, IF4 and IF5, display drivers DR1, DR2, DR3, DR4, DR5 and DR6, LED indicating lamps L1, L2, L3, L4, L5 and L6, an amplifier AMP for amplifying the signal from the fire detector SEi, a peak hold circuit PH for holding peak values of the output signal from the amplifier AMP, a calibrating standard voltage generating circuit SV, a trigger detecting circuit TD, a voltage comparating circuit VC, a flipflop FF, a clock generating circuit CL, and switches SW1, SW2, SW3, SW4, SW5, SW6, SW7, SW8, SW9 and SW10.

Figure 3:
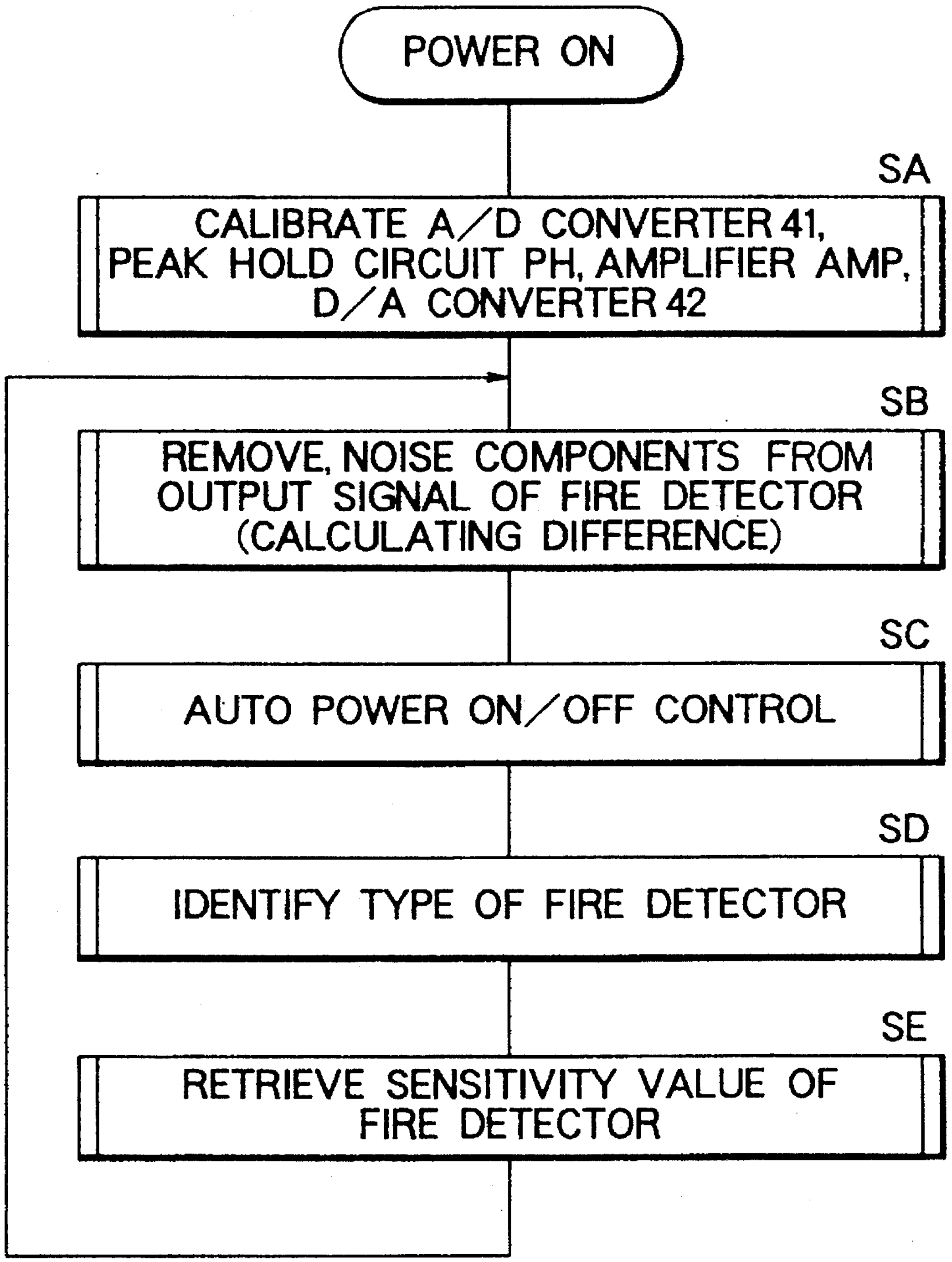
FIG. 3 is a flowchart showing the basic operation of the embodiment of the present invention.

ROM 21 stores a program whose flowchart is shown in FIG. 3. ROM 22 stores a reference table which indicates the correspondence between the output signal value of the fire detector SEi and the sensitivity value of the fire detector SEi.

RAM 31 stores the digital value of the output signal of the fire detector SEi. RAM 32 stores the sensitivity value retrieved on the basis of the output signal of the fire detector SEi, that is, the sensitivity value converted from the output value of the fire detector SEi. RAM 33 stores calibrating correction values. RAM 34 stores measured values which have been calibrated. RAM 35 stores averaged measured values. RAM 36 stores calibrated converted values.

The A/D converter 41 converts the analog output signal of the fire detector SEi into a digital signal. The D/A converter 42 converts the digital signal which is a retrieved sensitivity value into an analog signal.

The timer TM1 determines the read-in period during which the output of the fire detector SEi is read. The timer TM2 is used when the type of the fire detector is identified. The timer TM3 inhibits the clock from being input to the MPU 20, determines the time interval between the interruption of power supplying to the amplifier AMP and the restart of power supplying to the amplifier AMP, and repeats the supply of triggers to the timer TM2. The timer TM4 determines the period of a calibrating operation.

The LED indicator L1 indicates that a photoelectric type fire detector is connected to the sensitivity measuring apparatus 10. The LED indicator L2 indicates that a first ionization type fire detector is connected to the sensitivity measuring apparatus 10. The LED indicator L3 indicates that a second ionization type fire detector is connected to the sensitivity measuring apparatus 10. The LED indicator L4 indicates that power is on. The indicator L4 also indicates that the calibrating operation of the A/D converter 41 and the like has been completed. The LED indicator L5 indicates retrieved or measured sensitivity values are normal. The LED indicator L6 is a seven-segments display LED indicating retrieved sensitivity values. The above indicators L1 through L6 may be display means other than LEDs; for example, they may be liquid crystal displays.

The drivers DR1, DR2, DR3, DR4, DR5 and DR6 drive the indicators L1, L2, L3, L4, L5 and L6, respectively.

The switch SW1 is switched on when sensitivity measurements of the fire detector are made. The switch SW2 is switched on when sensitivity measurements of the ionization type fire detector are made. The switch SW3 is switched on when sensitivity measurements of the photoelectric type fire detector are made, when the output value of the peak hold circuit PH is calibrated or when the amplification gain of the amplifier AMP is calibrated. The switch SW4 is switched on when the amplification gain of the amplifier AMP is calibrated. The switch SW5 is switched on when the output value of the peak hold circuit PH is calibrated. The switch SW6 is switched on when the A/D converter 41 is calibrated. The switch SW7 is switched on when the D/A converter 42 is calibrated. The switch SW8 is switched on when sensitivity measurements of the fire detector are made. The switch SW9 is used to control the supplying of power to the A/D converter 41, the amplifier AMP, and the peak hold circuit PH. The switch SW10 is used to control the supplying of power to the D/A converter 42.

The calibrating standard voltage generator SV, constructed of ICS, generates a highly precise voltage required for the calibration of the A/D converter 41, the peak hold circuit PH, the amplifier AMP, and the D/A converter 42. The trigger detector circuit TD detects the reception of a pulse signal from the detector. The voltage comparator VC detects when the output signal from the fire detector is beyond a predetermined voltage level.

Figure 2A:
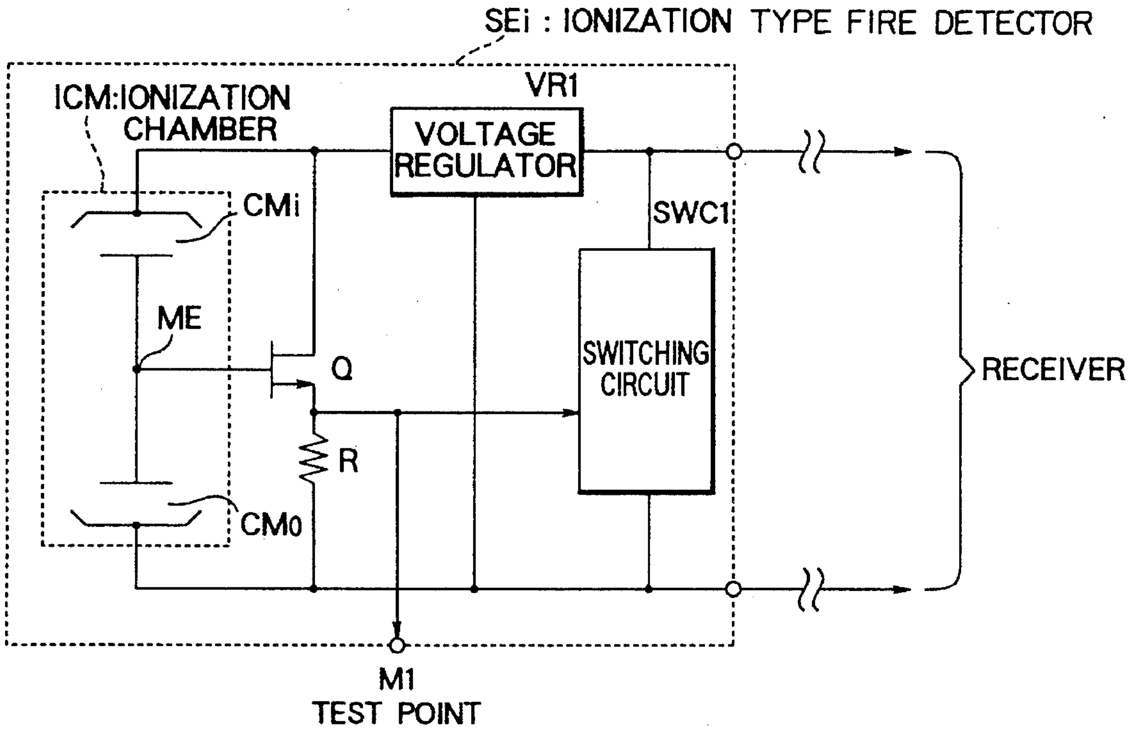
FIG. 2A and FIG. 2B are schematic diagrams respectively showing an ionization type fire detector SEi and a photoelectric type fire detector SEo, each of which may be connected to the embodiment of the present invention.

In FIG. 2A, the fire detector SEi comprises a voltage regulator circuit VR1, an ionization chamber ICM, a transistor Q, a source resistor R, and a switching circuit SWC1. The ionization chamber ICM comprises an inner ionization chamber CMi which allows no smoke in, and an outer ionization chamber CMo which allows smoke in and has higher and a higher impedance as the smoke density increases. The gate of the transistor Q is connected to the middle electrode ME at the junction point of the inner ionization chamber CMi and the outer ionization chamber CMo. A test point M1 which is connected to the source of the transistor Q is provided on the casing of the ionization type fire detector SEi. The output voltage of the fire detector SEi is picked up at the test point M1. The voltage level at the test point M1 rises as smoke density increases.

Figure 2B:
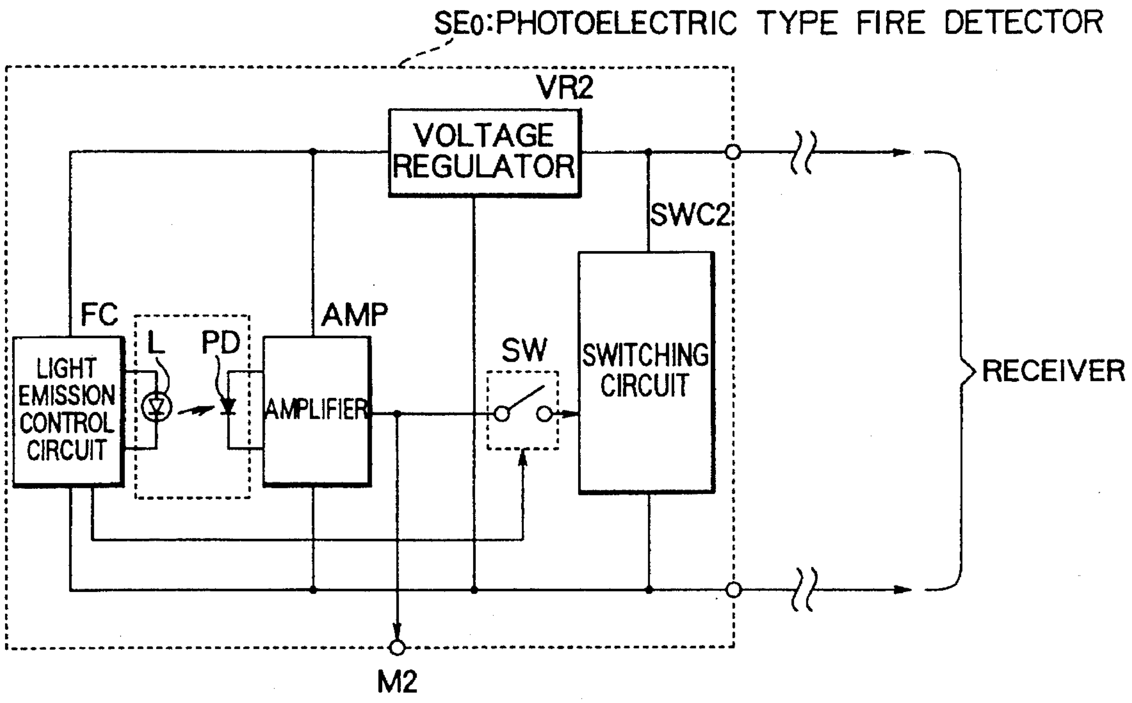

On the other hand, the photoelectric type fire detector SEo shown in FIG. 2B comprises a light emitting element L, a light emission control circuit FC for controlling the light emitting element L, a light receiving element PD for receiving scattered light, an amplifier circuit AMP for amplifying the output signal of the light receiving element PD, a voltage regulator circuit VR2, a switch SW, and a switching circuit SWC2. The light emitting element L emits light intermittently.

Referring to the flowchart shown in FIG. 3, the general operation of the embodiment in FIG. 1 is now described.

The test point M1 of the fire detector SEi is connected to the input terminal of the sensitivity measuring apparatus 10. The output terminal of the sensitivity measuring apparatus 10 is connected to the voltmeter VM. Upon switching on the sensitivity measuring apparatus 10, the MPU 20 internally performs diagnostic checks of the sensitivity measuring apparatus 10. When no error conditions are detected, the MPU 20 calibrates, at step SA, the A/D converter 41, the peak hold circuit PH, the amplifier circuit AMP, and the D/A converter 42. At step SB, noise components are removed from the output of the fire detector SEi by calculating the differential of the output signal of the fire detector SEi. At step SC, an auto power on-off control is performed: for example, power is automatically turned off or the supply of clock pulses is automatically stopped if no output signal is received from the fire detector SEi for a predetermined time duration during the operation of the sensitivity measuring apparatus 10; power is automatically turned on or the supply of clock pulses is automatically started when the output signal is received from the fire detector SEi. At step SD, the type of the fire detector is identified on the basis of the signal output duration during which the signal is output, and the period and level of the output signal of the fire detector. At step SE, according to the identified type of the fire detector, the present sensitivity of the fire detector is retrieved, namely the output signal value of the fire detector is converted into the corresponding sensitivity value.

Figure 4:
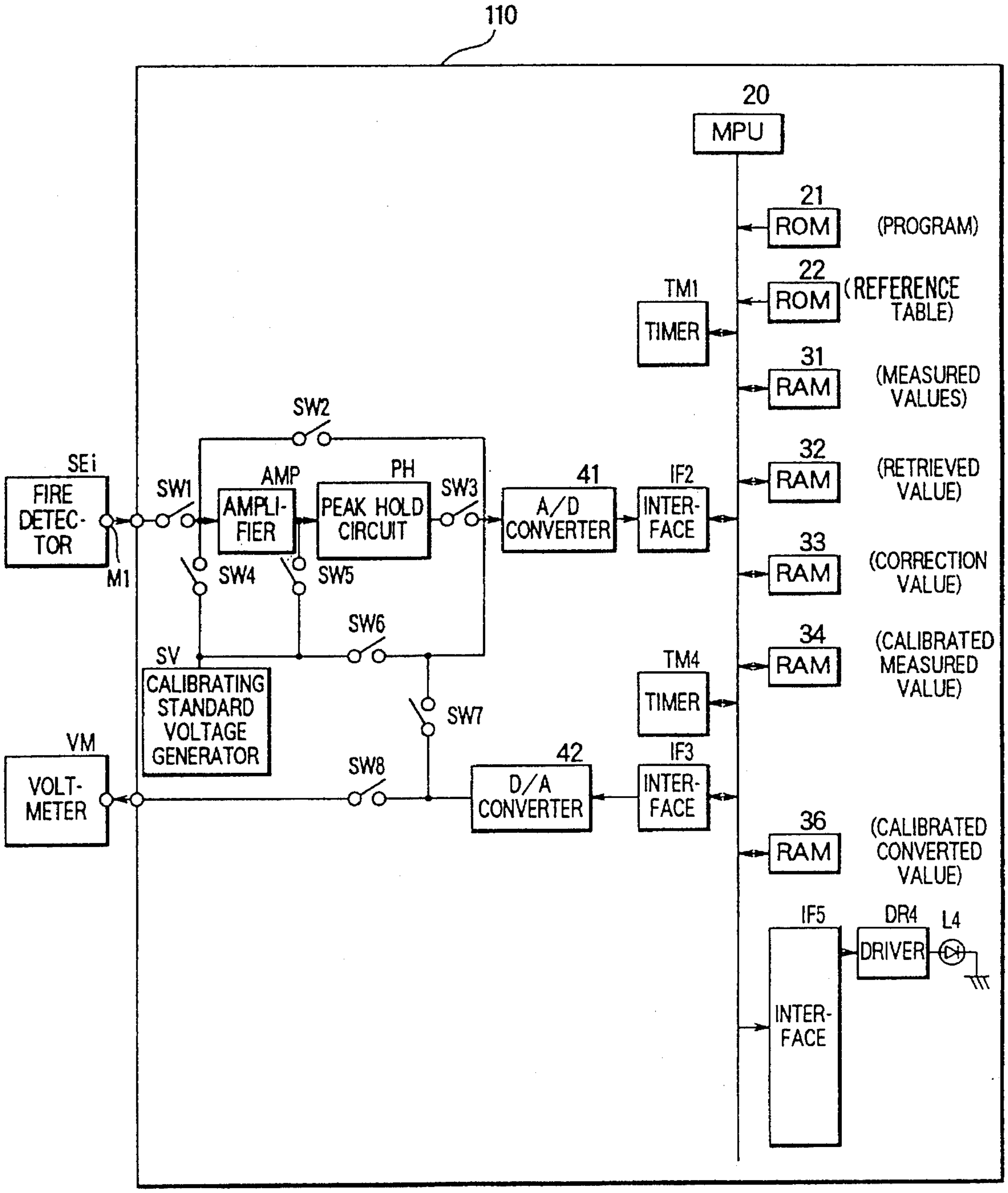
FIG. 4 is a block diagram corresponding to part of the block diagram of FIG. 1 related to a calibration operation in the embodiment of the present invention.

FIG. 4 is a block diagram of part of the block diagram of FIG. 1 related to the calibrating operation of the above described circuits in the above embodiment. Sensitivity measuring apparatus 110 is part of the sensitivity measuring apparatus 10 needed to carry out the above described calibration.

In FIG. 4, the sensitivity measuring apparatus 110 comprises MPU (microprocessor unit) 20 which controls the entire operation of the sensitivity measuring apparatus 110, ROMs 21 and 22, RAMs 31, 32, 33, 34, and 36, an A/D converter 41 for converting an analog signal into a digital signal, a D/A converter 42 for converting a digital signal into an analog signal, timers TM1 and TM4, interfaces IF2, IF4 and IF5, a display driver DR4, an LED indicator L4, an amplifier AMP for amplifying the signal from the fire detector SEi, a peak hold circuit PH for holding peak values of the output signal of the amplifier AMP, a calibrating standard voltage generator circuit SV, and switches SW1, SW2, SW3, SW4, SW5, SW6, SW7, and SW8.

Figure 5:
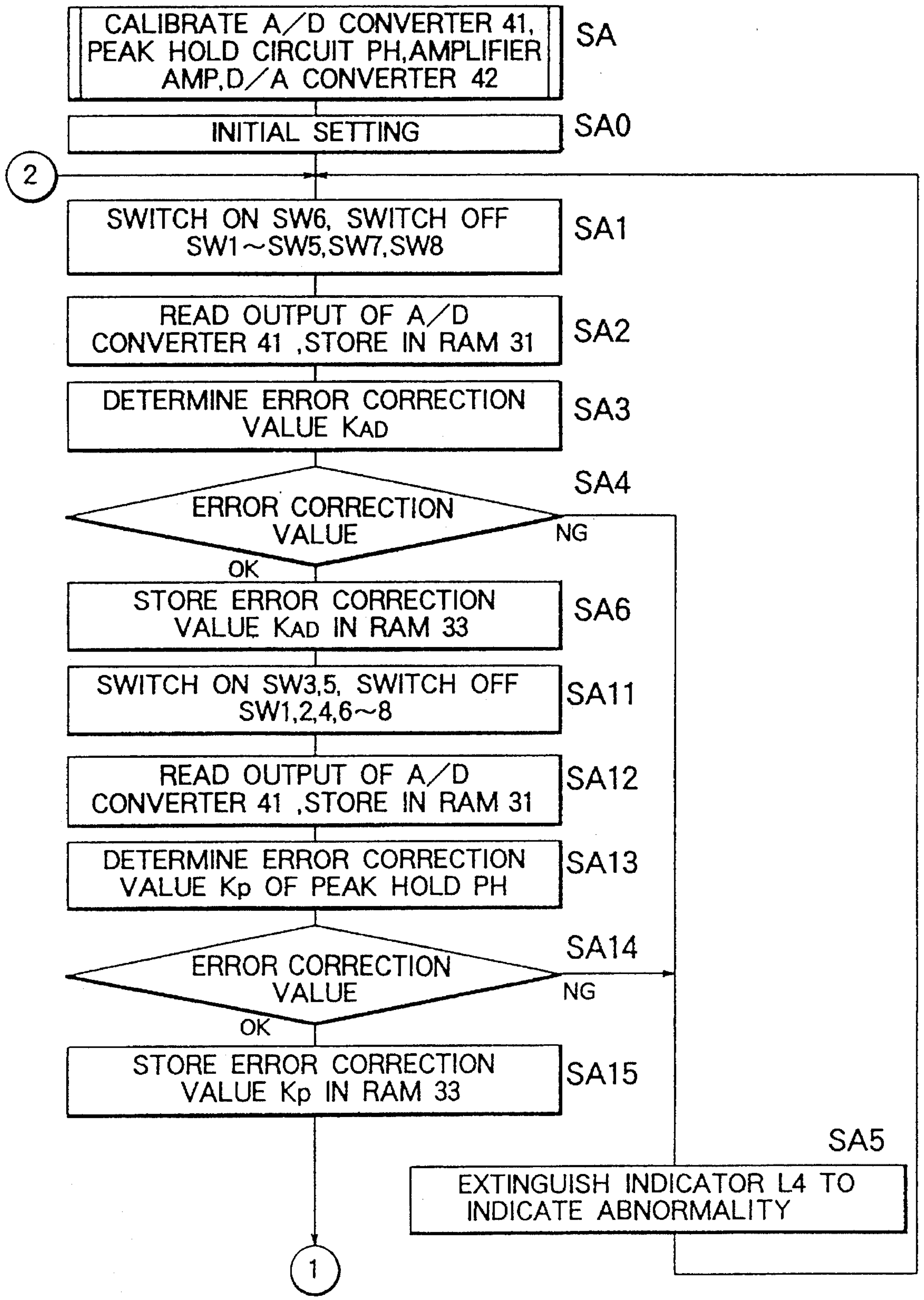
FIG. 5 and FIG. 6 are flowcharts describing an example of the calibration operation.

The ROM 21 stores a program whose flowchart is shown in FIG. 5. The ROM 22 stores the reference table indicating the correspondence between the output signal value of the fire detector SEi and the sensitivity value of the fire detector SEi.

The RAM 31 stores the digital value of the output signal of the fire detector SEi. The RAM 32 stores the retrieved sensitivity value obtained on the basis of the output signal of the fire detector SEi (the sensitivity value converted from the output value of the fire detector SEi). The RAM 33 stores calibrating values. The RAM 34 stores calibrated measured values. The RAM 36 stores calibrated converted values.

The A/D converter 41 converts the analog output signal of the fire detector SEi into a digital signal. The D/A converter 42 converts the digital signal which is the retrieved sensitivity value into an analog signal.

The timer TM1 determines the read-in period during which the output of the fire detector SEi is read. The timer TM 4 determines the period of the calibrating operation.

The LED indicator L4 indicates that power is on. The LED indicator L4 also indicates that the calibrating operation has been completed. The driver DR4 drives the LED indicator L4.

The switch SW1 is switched on when sensitivity measurements of the connected fire detector are made. The switch SW2 is switched on when sensitivity measurements of the ionization type fire detector SEi are made. The switch SW3 is switched on when sensitivity measurements of the photoelectric type fire detector SEo are made, or when the output value of the peak hold circuit PH is calibrated or when the amplification gain of the amplifier AMP is calibrated. The switch SW4 is switched on when the amplification gain of the amplifier AMP is calibrated. The switch SW5 is switched on when the output value of the peak hold circuit PH is calibrated. The switch SW6 is switched on when the A/D converter 41 is calibrated. The switch SW7 is switched on when the D/A converter 42 is calibrated. The switch SW8 is switched on when sensitivity measurements of the fire detector are made.

The calibrating standard voltage generator SV, constructed of ICS, generates a highly precise voltage required for the calibration of the A/D converter 41, the peak hold circuit PH, the amplifier AMP, and the D/A converter 42.

The ROM 21 and the ROM 22 associated with the MPU 20 are an example of sensitivity measuring means in which the measurement of the fire detector is performed by inputting the output signal of the fire detector. The calibrating standard voltage generator circuit SV is an example of calibrating signal generator means. Both the MPU 20 and the ROM 21 are an example of calibrating means for calibrating the sensitivity measuring means on the basis of the reference signal for calibration. The measuring means to be calibrated is constructed of analog signal processing means which performs at least one of the three functions of the signal impedance matching function, amplifying function and signal holding function, A/D converting means for converting the analog output signal output from the analog signal processing means into a digital signal, and digital signal processing means for processing the digital signal output from the A/D converting means. The calibrating means thus calibrates the digital signal which the A/D converting means outputs to the digital signal processing means. The A/D converter 41 is an example of the A/D converting means. MPU 20, ROM 21 and ROM 22 are an example of the digital signal processing means for processing the digital signal.

The means for outputting the sensitivity values is constructed of the D/A converting means for converting a digital signal into an analog signal and the digital signal processing means for processing the digital signal which is fed to the D/A converting means, whereby the calibrating means calibrates the digital signal which the digital signal processing means outputs to the D/A converting means. The calibrating operation is performed by the calibrating means every predetermined period of time and at the turn-on of the sensitivity measuring apparatus. Based on the calibration result by the calibrating means, an indicator output or a sound output is provided to indicate whether or not the calibration is normal or abnormal. While the calibrating operation by the calibrating means is in progress, no signal input is allowed into the sensitivity measuring apparatus from the outside. Also, while the calibrating operation by the calibrating means is in progress, no signal output is allowed from the sensitivity measuring apparatus to the outside.

Figure 6:
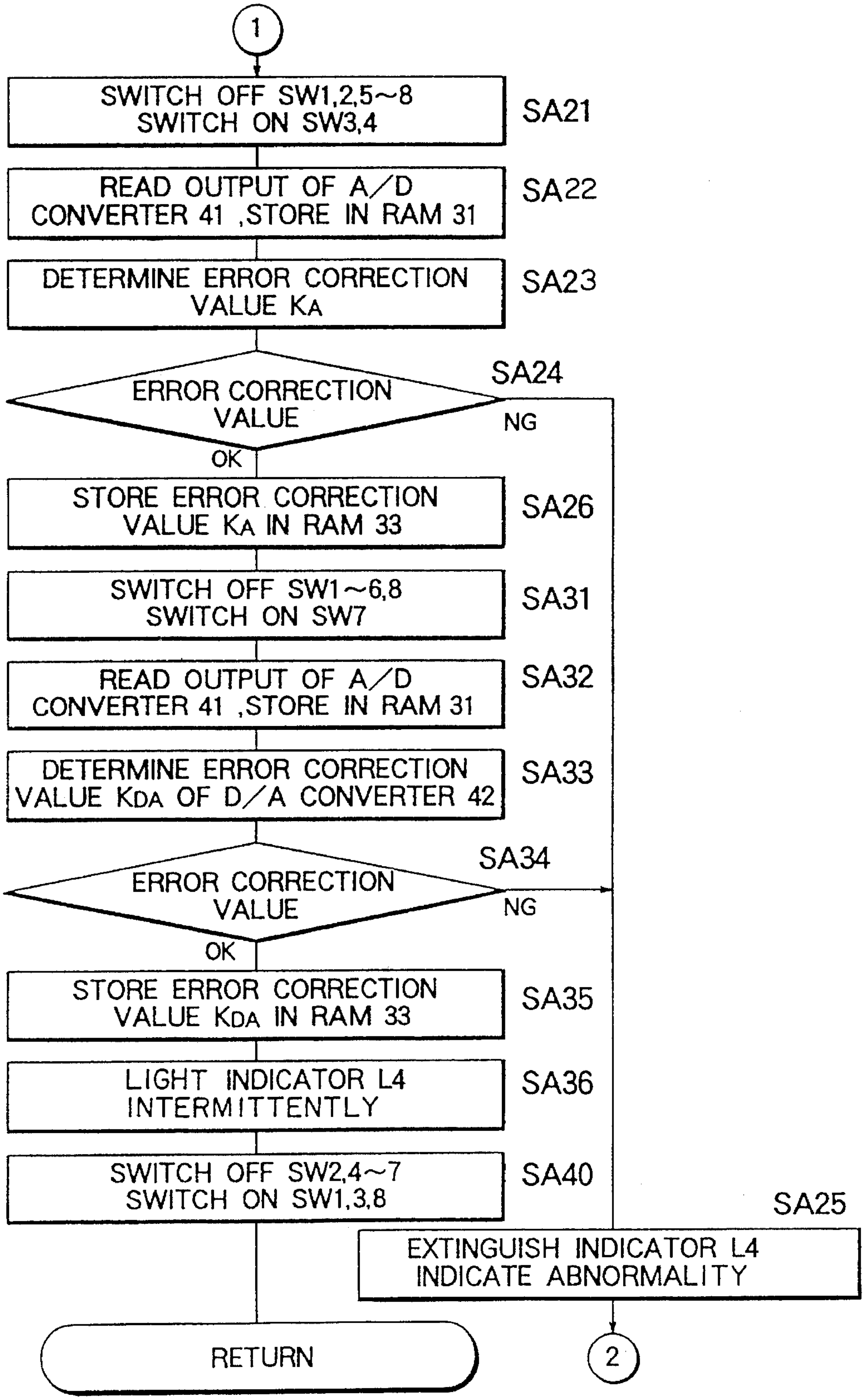

The operation of the above calibrating operation is now described. FIG. 5 and FIG. 6 are flowcharts related to the calibrating operation in the above embodiment. Its program is stored in ROM 21.

Discussed first is how an error calibration or correction value $K_{AD}$ of the A/D converter 41 is determined. Variations in the reference voltage of the A/D converter 41 causes errors. To exclude error components, the A/D converter 41 is calibrated.

At step SA0, initial setting is performed. At step SA1, the MPU 20 switches off switches SW1 though SW5, SW7 and SW8, and switches on switch SW6, in order to feed a standard voltage generated by the calibrating standard voltage generator SV to the input terminal of the A/D converter 41. At step SA2, the MPU 20 reads the digital signal values given by the A/D converter 41, and stores the read values to RAM 31. At step SA3, the error correction value $K_{AD}$ of the A/D converter 41 is calculated on the basis of the values stored in RAM 31.

The error correction value $K_{AD}$ is the ratio of the output data θ r0 with the error-free reference voltage $V_{AD}$r0 used, to the output data θ r1 with the error-contained reference voltage $V_{AD}$r1, in the A/D converter 41, and expressed as follows:

$$K_{AD}=\theta r0/\theta r1 \quad (1)$$

therefore, $$\theta r0=K_{AD}\times\theta r1 \quad (2)$$

This means that if the error correction value $K_{AD}$ of the A/D converter 41 is determined, the output data θ r0 with the error-free reference voltage $V_{AD}$r0, that is, calibrated output data θ r0 is obtained.

The following method may be employed to calculate the error correction value $K_{AD}$. Let Vin represent an input voltage of the A/D converter 41, and $V_{AD}r$ the reference voltage of the A/D converter 41 (different from standard voltage Vr generated by the calibrating standard voltage generator SV). Assuming that the A/D converter 41 provides an 8-bit output, the output data as θ of the A/D converter 41 is expressed as follows:

$$\theta=(Vin/V_{AD}r)\times 256 \quad (3)$$

If variations occur in the reference voltage $V_{AD}r$, the output data θ of the A/D converter 41 includes an error.

Let $V_{AD}$r0 represent the error-free reference voltage of the A/D converter 41, $V_{AD}$r1 the error-contained reference voltage of the A/D converter 41, θ 0 the error-free output data of the A/D converter 41, and θ 1 the error-contained output data. From equation (3), $$\theta 0=(Vin/V_{AD}r0)\times 256 \quad (4)$$

$$\theta 1=(Vin/V_{AD}r1)\times 256 \quad (5)$$

The standard voltage Vr generated by the calibrating standard voltage generator SV is now input to the A/D converter 41. Let θ r0 represent the output with the error-free reference voltage $V_{AD}$r0, and θ r1 the output with the error-contained reference voltage $V_{AD}$r1. From equations (4) and (5), $$\theta r0=(Vr/V_{AD}r0)\times 256 \quad (6)$$

$$\theta r1=(Vr/V_{AD}r1)\times 256 \quad (7)$$

From (1) , the error correction value $K_{AD}$ is $$K_{AD}=\theta r0/\theta r1$$

Substitution of equations (6) and (7) into equation (1) is reduced as follows:

$$\begin{aligned} K_{AD} &= \theta r0/\theta r1 \quad (8)\\ &= \{(Vr/V_{AD}r0)\times 256\}/\{(Vr/V_{AD}r1)\times 256\}\\ &= V_{AD}r1/V_{AD}r0 \end{aligned}$$

If the output data θ r1 obtained with the reference voltage $V_{ADr1}$ used is multiplied by the error correction value $K_{AD}$, from equations (7) and (8), $$\begin{aligned} &\theta r1\times K_{AD}\\ &= \{(Vr/V_{AD}r1)\times 256\}\times\{V_{AD}r1/V_{AD}r0\}\\ &= (Vr/V_{AD}r0)\times 256 \end{aligned}$$

and by substituting equation (6) into the above equation, $$\begin{aligned} &\theta r1\times K_{AD}\\ &= (Vr/V_{AD}r0)\times 256\\ &= \theta r0 \end{aligned}$$

Thus, if the output data θ r1 obtained with the error-contained reference voltage $V_{AD}$r1 used in the A/D converter is multiplied by the error correction value $K_{AD}$, the error-free output data θ r0 will be obtained with the error-free reference voltage $V_{AD}$r0. Namely, if the actual output of the A/D converter 41 is multiplied by the error correction value $K_{AD}$, an error-free output of the A/D converter 41 will be obtained. The output value of the A/D converter 41 can be calibrated in this manner.

After the error correction value $K_{AD}$ of the A/D converter 41 is determined at step SA3, whether or not the determined error correction value $K_{AD}$ falls within a predetermined range is examined at step SA4. If the determined error correction value $K_{AD}$ fails to fall within the predetermined range, the interface IF5 and then the driver DR4 are driven at step SA5 to turn the indicator lamp L4 off which also works as a power lamp so that an abnormal state is indicated. If the determined error correction value $K_{AD}$ falls within the predetermined range, the determined error correction value $K_{AD}$ is stored in RAM 33 at step SA6, and the error correction value Kp of the peak hold circuit PH is then calculated. The indicator lamp L4 may be used to indicate an abnormal state as described above. Alternatively, the indicator lamp L4 may be used to indicate that all the error correction values are normal if the other error correction values described later are also normal.

Discussed next is how to calculate the error correction values Kp of the peak hold circuit PH. When the MPU 20 switches switches SW1, SW2, SW4, SW6, SW7, SW8, and switches on switches SW3 and SW5 at step SA11, the standard voltage generated by the calibrating standard voltage generator SV is supplied to the input terminal of the peak hold circuit PH. The MPU 20 then reads the digital signal provided by the A/D converter 41 at step SA12 and stores the read values in RAM 31. At step SA13, the error correction value Kp of the peak hold circuit PH is calculated on the basis of the values stored in RAM 31.

When the peak hold circuit PH has an offset voltage Vf, an error is contained in the output data of the A/D converter 41. The error correction value Kp needed to remove the error is determined as follows: the output data of the A/D converter 41 in the existence of the offset voltage Vf in the peak hold circuit PH, is multiplied by the error correction value $K_{AD}$ of the A/D converter 41, and then the error correction value Kp is obtained by subtracting the output data of the A/D converter 41 in the absence of the offset voltage Vf from the result of the multiplication.

The standard voltage Vr of the calibrating standard voltage generator SV is now supplied to the peak hold circuit PH. Let θ p0 represent the output data of the A/D converter 41 in the absence of the offset voltage Vf in the peak hold circuit PH, and θ p1 the output data of the A/D converter 41 in the presence of the offset voltage Vf.

$$\theta p0=(Vr/V_{AD}r0)\times 256 \quad (9)$$

and $$\theta p1=\{(Vr+Vf)/V_{AD}r1\}\times 256 \quad (10)$$

To remove the error due to the A/D converter 41 from the output data θ p1 of the A/D converter 41 in the presence of the offset voltage Vf, the output data θ p1 is multiplied by the error correction value $K_{AD}$.

$$\theta\, p1 \times K_{AD} = \{(Vr + Vf)/V_{AD}r1\} \times 256 \times V_{AD}r1/V_{AD}r0 = \{(Vr + Vf)/V_{AD}r0\} \times 256 \quad (11)$$

The error correction value Kp of the peak hold circuit PH is obtained by subtracting the output data θ p0 of the A/D converter 41 in the absence of the offset voltage Vf from the result of the multiplication in which the output data θ p1 of the A/D converter 41 in the presence of the offset voltage Vf is multiplied by the error correction value $K_{AD}$ of the A/D converter 41. Therefore, $$Kp = \theta p1 \times K_{AD} - \theta\, p0 \quad (12)$$

Substituting equations (11) and (9) into (12), $$\begin{aligned} Kp &= \theta\, p1 \times K_{AD} - \theta\, p0 \\ &= \{(Vr + Vf)/V_{AD}r0\} \times 256 - (Vr/V_{AD}r0) \times 256 \\ &= (Vf/V_{AD}r0) \times 256 \end{aligned} \quad (13)$$

Since the offset voltage Vf and the error-free standard voltage $V_{AD}$r0 are known values, the error correction value Kp of the peak hold circuit PH is obtained from equation (13) .

Let Vinp represent the input signal of the peak hold circuit PH, θ 2 the A/D converted value of the input signal Vinp. The peak hold circuit PH is calibrated by using the error correction value Kp as follows:

$$\theta\, 2 = \{(Vinp + Vf)/V_{AD}r0\} \times 256 \quad (14)$$

$$\theta\, 2 - Kp = \{(Vinp + Vf)/V_{AD}r0\} \times 256 - (Vf/V_{AD}r0) \times 256 = (Vinp/V_{AD}r0) \times 256 \quad (15)$$

By using the error correction value Kp of the peak hold circuit PH, the error Vf of the peak hold circuit PH can be thus removed.

After the error correction value Kp of the peak hold circuit PH is determined at step SA13, whether or not the determined error correction value Kp falls within a predetermined range is examined at step SA14. If the determined error correction value Kp fails to fall within the predetermined range, the interface IF5 and then the driver DR4 are driven to turn the indicator lamp L4 off in order to indicate an abnormal state at step SA5. If the determined error correction value Kp falls within the predetermined range, the determined error correction value $K_p$ is stored in RAM 33 at step SA15, and the error correction value Kp of the peak hold circuit PH is calculated.

Discussed next is how to determine the error correction values $K_A$ the amplifier AMP. With switches SW1, SW2, SW5, SW6, SW7, SW8 switched off and switches SW3 and SW4 switched on at step SA21 in FIG. 6, the standard voltage generated by the calibrating standard voltage generator SV is supplied to the input terminal of the amplifier AMP. The MPU 20 then reads the digital signal output from the A/D converter 41 at step SA22 and stores the read values in RAM 31. At step SA23, the error correction value $K_A$ of the amplifier AMP is calculated on the basis of the values stored in RAM 31.

When the amplification gain of the amplifier AMP suffers variations, an error is contained in the output data from the A/D converter 41. The following process is available to determine the error correction value $K_A$ which is used to remove the error. The error correction value $K_A$ of the amplifier AMP is the amplification gain compensated for the error.

Let α 0 represent the typical amplification gain of the amplifier AMP, α 1 the amplification gain of the amplifier AMP when it suffers variations, Vf the offset voltage of the peak hold circuit PH, θ a0 the A/D converted value when the amplification gain of the amplifier AMP is α 0, and θ a1 the A/D converted value when the amplification gain of the amplifier AMP is α 1. Then, $$\theta\, a0 = (Vr \times \alpha\, 0/V_{AD}r0) \times 256 \quad (16)$$

$$\theta\, a1 = \{(Vr \times \alpha\, 1 + Vf)/V_{AD}r1\} \times 256 \quad (17)$$

By using the error correction value $K_{AD}$ of the A/D converter 41, calculations are made to remove the error attributable to the error-contained reference voltage $V_{AD}$r1 of the A/D converter 41. From equations (17) and (8), $$\theta\, a1 \times K_{AD} = \{(Vr \times \alpha\, 1 + Vf)/V_{AD}r1\} \times 256 \times V_{AD}r1/V_{AD}r0 = \{(Vr \times \alpha\, 1 + Vf)/V_{AD}r0\} \times 256 \quad (18)$$

The error due to the offset value can be removed by using equation (18) and the error correction value Kp expressed by equation (13) as follows:

$$\theta\, a1 \times K_{AD} - Kp = \{(Vr \times \alpha\, 1 + Vf)/V_{AD}r0\} \times 256 - (Vf/V_{AD}r0) \times 256 = \{(Vr \times \alpha\, 1)/V_{AD}r0\} \times 256 \quad (19)$$

In the sensitivity measuring apparatus 110, Vr, α 0, and $V_{AD}$r0 are known values. By using θ a0 obtained in equation (16), the error correction values $K_A$ for calibrating an error due to the variations of amplification gain of the amplifier AMP is determined as follows:

$$\begin{aligned} K_A &= \theta\, a0/(\theta\, a1 \times K_{AD} - Kp) \\ &= \{(Vr \times \alpha\, 0/V_{AD}r0) \times 256\}/[\{(Vr \times \alpha\, 1)/V_{AD}r0\} \times 256] \\ &= \alpha\, 0/\alpha\, 1 \end{aligned} \quad (20)$$

In actual sensitivity measurements, errors are removed from measurements on the basis of each of the above error correction values.

The standard voltage of the amplifier AMP is represented by Vr in the same manner as the standard voltage Vr (standard voltage generated by the calibrating standard voltage generator SV) is for the calibrating operation of the peak hold circuit PH. If the amplification degree of the amplifier AMP is so large that the amplifier is saturated, the standard voltage Vr may be lowered by a voltage divider or the like. Switches (not shown) may be included to each circuit to be calibrated so that appropriate standard voltage may be selected.

Assuming that the A/D converted value θ 3 is obtained with an input voltage Vina applied to the amplifier AMP having a variation-affected amplification degree α 1, the error correction value $K_A$ is applied to calibration as detailed below. It is further assumed that the calibration of the A/D converter 41 and the peak hold circuit PH are performed in the same manner as already described, that $V_{AD}$r0 represents the reference voltage for A/D conversion, and that no offset voltage exists in the peak hold circuit PH.

$$\theta\, 3 = \{(Vina \times \alpha\, 1)/V_{AD}r0\} \times 256 \quad (21)$$

-continued $$\theta 3 \times K_A = \{(Vina \times \alpha 1)/V_{AD}r0\} \times 256 \times (\alpha 0/\alpha 1) = \{(Vina \times \alpha 0)/V_{AD}r0\} \times 256 \quad (22)$$

By using the error correction value $K_A$, the error of the amplifier AMP can be removed.

After determining the error correction value $K_A$, the sensitivity measuring apparatus 110 determines at step SA24 whether or not the determined error correction value $K_A$ falls within a predetermined range. If it is within the predetermined range, the error correction value $K_A$ is stored in RAM 33 at step SA26. If the determined error correction value $K_A$ is abnormal, that is, failing to fall within the predetermined range, the indicator lamp L4 will turn off to alert the inspector that the calibration result is abnormal at step SA25 in the same manner as the calibration of the A/D converter 41 and the like.

At step SA31, the MPU 20 switches off switches SW1 through SW6, and SW8, and switches on switch SW7 in the sensitivity measuring apparatus 110. This allows the A/D converter 42 to send its output signal to the A/D converter 41. At step SA32, the MPU 20 reads the digital signal value output from the A/D converter 41, and stores the read value in RAM 31. At step SA33, the error correction value $K_{DA}$ of the D/A converter 41 is determined on the basis of the stored value in RAM 31.

Let represent ω the input to the A/D converter 42, $V_{DA}r$ the reference voltage of the D/A converter 42. Assuming that the D/A converter 42 is an 8-bit converter, a converted value Vd is $$Vd=(\omega/256)\times V_{DA}r \quad (23)$$

When the reference voltage $V_{DA}r$ for D/A conversion varies, the converted value naturally contains errors attributable to the variations. The errors must be removed.

Let $V_{DA}$r0 represent the standard reference voltage of the D/A converter 42, $V_{DA}$r1 the reference voltage of the D/A converter 42 suffering variations in comparison with the standard reference voltage. Converted values Vd0 and Vd1 for respective reference voltages are:

$$Vd0=(\omega/256)\times V_{DA}r0 \quad (24)$$

$$Vd1=(\omega/256)\times V_{DA}r1 \quad (25)$$

In the sensitivity measuring apparatus 110, the known value ω is input to the D/A converter 42 in the calibration of the D/A converter 42, and then the output of the D/A converter 42 is converted by the A/D converter 41. The standard A/D converted value θ d0 and varied value θ d1 are expressed by using the standard reference voltage $V_{DA}$r0 of the A/D converter 41 and the standard reference voltage $V_{DA}$r1 of the A/D converter 41 which suffers from variations, $$\theta d0 = (Vd0/V_{AD}r0)\times 256 = \{(\omega/256)\times V_{DA}r0/V_{AD}r0\}\times 256 = \omega\times V_{DA}r0/V_{AD}r0 \quad (26)$$

$$\theta d1 = (Vd1/V_{AD}r1)\times 256 = \{(\omega/256)\times V_{DA}r1/V_{AD}r1\}\times 256 = \omega\times V_{DA}r1/V_{AD}r1 \quad (27)$$

The sensitivity measuring apparatus 110 calibrates the error attributable to the variations of the A/D converted value θ d1 by using the error correction value $K_{AD}$ of the A/D converter 41 as follows:

$$\theta d1 \times K_{AD} = \omega \times V_{DA}r1/V_{AD}r1 \times (V_{AD}r1/V_{AD}r0) = \omega \times V_{DA}r1/V_{AD}r0 \quad (28)$$

In the sensitivity measuring apparatus 110, ω, $V_{DA}$r0, and $V_{AD}$r0 are known values. By using another known value θ d0, an error calibration value $K_{DA}$ for calibrating the error attributable to variations of the reference voltage of the D/A converter 42 is determined below.

$$K_{DA} = \theta d0/(\theta d1 \times K_{AD}) = (\omega\times V_{DA}r0/V_{AD}r0)/(\omega\times V_{DA}r1/V_{AD}r0) = V_{DA}r0/V_{AD}r1 \quad (29)$$

It is assumed that an input ϕ is applied to the D/A converter 42 to give an output value Vout with the standard reference voltage $V_{DA}$r0 for the D/A converter 42. According to the reference voltage $V_{DA}$r1 of the D/A converter 42 which actually suffers variations, the input signal value of the D/A converter 42 is calibrated as follows:

*Error-free standard input-output relationship is* $Vout=\phi/256\times V_{DA}r0 \quad (30)$ The input value of the D/A converter 42 is now calibrated with the error calibration value $K_{DA}$. The output Vout of the D/A converter 42 is expressed by using calibrated input signal value $\phi\times K_{DA}$ and the reference voltage $V_{DA}$r1 of the D/A converter 42 as follows:

$$Vout = \{(\phi\times K_{DA})/256\}\times V_{DA}r1 = [\{\phi\times(V_{DA}r0/V_{DA}r1)\}/256]\times V_{DA}r1 = (\phi/256)\times V_{DA}r0 \quad (31)$$

The error calibration value $K_{DA}$ removes the error of the D/A converter 42 in this way.

After determining the error calibration value $K_{DA}$, the sensitivity measuring apparatus 110 determines at step SA34 whether or not the determined error calibration value $K_{DA}$ falls within a predetermined range. If it is within the predetermined range, the error calibration value $K_{DA}$ is stored in RAM 33 at step SA35. If the determined error calibration value $K_{DA}$ is abnormal, that is, failing to fall within the predetermined range, the indicator lamp L4 will turn off to alert the inspector that the calibration result is abnormal at step SA25 in the same as the calibration of the A/D converter 41 and the like. Throughout each of the above calibrating operations, switches SW1 and SW8 are switched off to exclude the interference of external signals.

The sensitivity measuring apparatus 110, if the calibration result proves normal, switches the operation mode of the calibration-error indicator lamp L4 from a continuous lighting mode to a flickering mode, and continues the flickering of the lamp L4 for a predetermined time at step SA36. At step SA40, the apparatus switches on switches SW1, SW3, and SW8, and switches off SW2, SW4 through SW7. The operation flow then returns. In the photoelectric type fire detector SEo, each time the timer TM1 counts up, the output of the fire detector is sent via the signal amplifier AMP and the peak hold circuit PH to the A/D converter 41, in which the output of the fire detector is A/D converted, and then stored into RAM 31. Since the A/D converted data q stored includes error due to the tolerance of each circuit, it is calibrated with error calibration values stored in RAM 33. The calibrated value $Q_v$ is stored in RAM 34.

$$Q_v=(q\times K_{AD}-Kp)\times K_A \qquad (32)$$

The sensitivity measuring apparatus 110 refers to ROM 22 which stores a reference table in which measured data is converted into sensitivity. Before outputting the sensitivity value via the D/A converter 42, the sensitivity measuring apparatus 110 calibrates the sensitivity value h to be appropriate, and the calibrated sensitivity value $H_v$ is stored in RAM 36. The calibrated sensitivity value $H_v$ is also sent to the D/A converter 42 at the same time and converted to a sensitivity. It means, $$H_v=h\times K_{DA} \qquad (33)$$

The sensitivity measuring apparatus 110 carries out the above calibrating operation not only each time the timer TM1 counts up but also each time the timer TM2 counts up.

Figure 7:
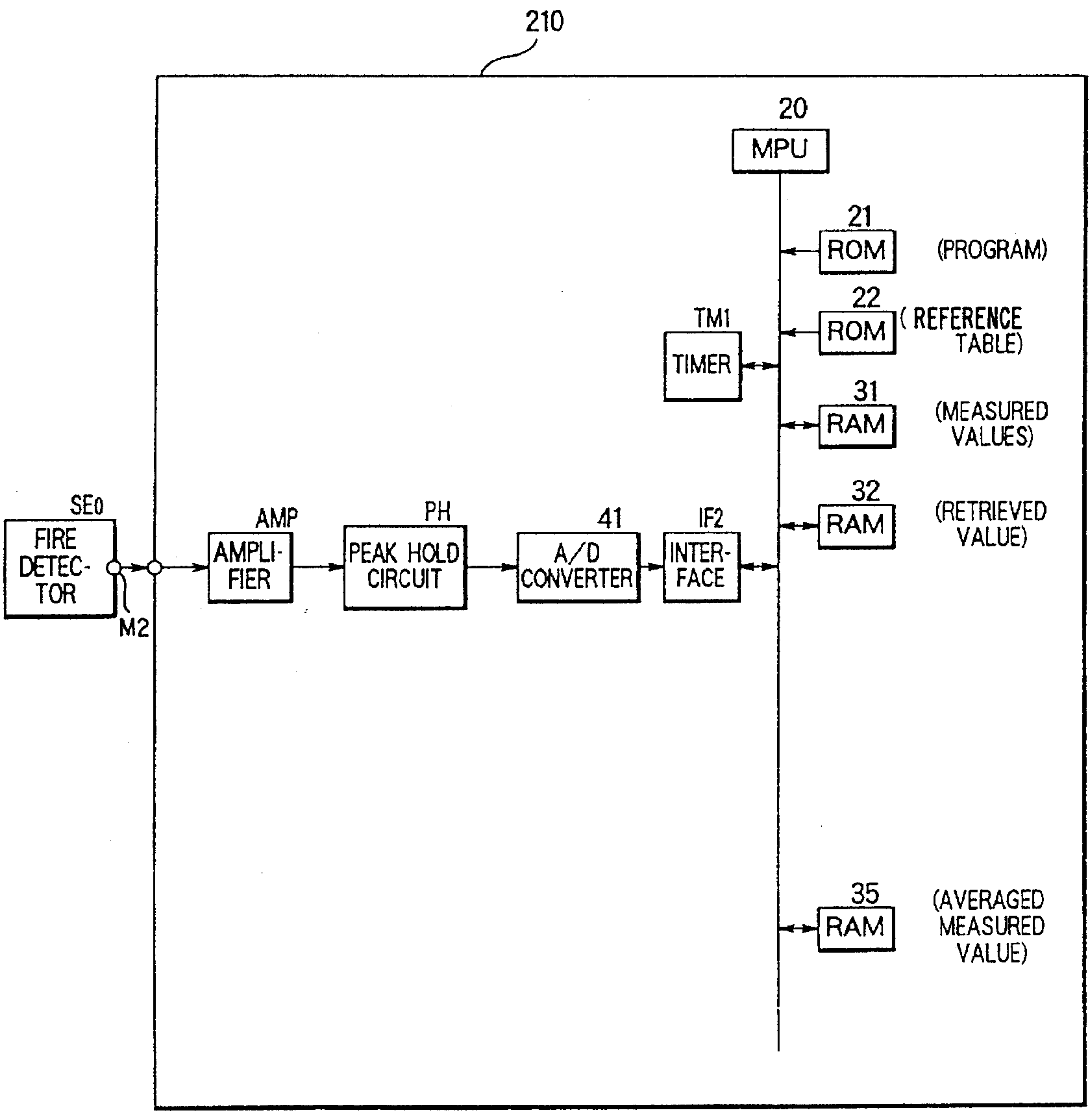
FIG. 7 is a block diagram corresponding to part of the block diagram of FIG. 1 related to a noise elimination operation in the embodiment of the present invention.

FIG. 7 is a block diagram of part of the block diagram of FIG. 1 related to the noise eliminating operation of the output signal of the fire detector in the above embodiment. The part of the sensitivity measuring apparatus 10 needed for the noise eliminating operation is designated as sensitivity measuring apparatus 210 in FIG. 7.

In FIG. 7, the sensitivity measuring apparatus 210 comprises the MPU 20 which controls the entire operation of the sensitivity measuring apparatus 210, the ROMs 21 and 22, the RAMs 31, 32 and 35, a timer TM1, the amplifier AMP for amplifying the output signal from the fire detector SEo, a peak hold circuit PH for holding peak-valued signals of the output signal of the amplifier AMP, and an A/D converter 41 for converting an analog signal into a digital signal.

Figure 8:
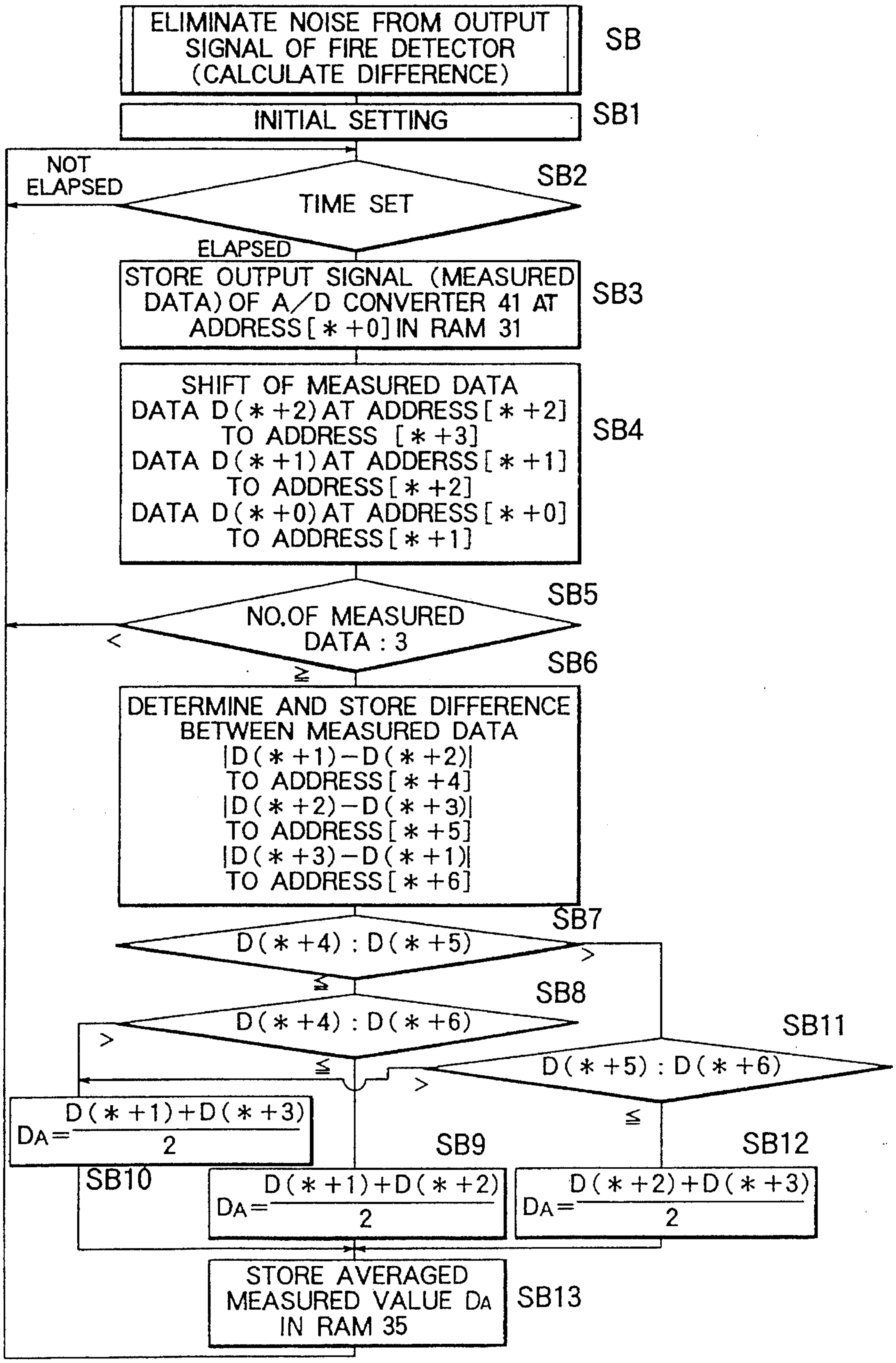
FIG. 8 is a flowchart showing an example of the noise elimination operation.

The ROM 21 stores a program whose flowchart is shown in FIG. 3. This ROM 21 also stores a program whose flowchart is shown in FIG. 8. The ROM 22 stores a reference table which lists the output signal of the fire detector SEo versus the sensitivity of the fire detector SEo.

The RAM 31 stores the digital value of the output signal of the fire detector SEo. The RAM 32 stores the sensitivity value (sensitivity value converted from the output signal of the fire detector SEo) retrieved based on the output signal of the fire detector SEo. The RAM 35 stores averaged measured data.

In the sensitivity measurement, the timer TM1 determines the read-in period during which the output of the fire detector is read.

The MPU 20, ROM 21, ROM 22, RAM 31, RAM 32, the amplifier AMP, the peak hold circuit PH, the A/D converter 41, and the timer TM1 constitute an example of the sensitivity measuring means for determining the sensitivity of the fire detector on the basis of data obtained by measuring the output signal every predetermined period of time. The MPU 20, ROM 21 and RAM 31 constitute an example an extracting means which extracts a second predetermined number of measured data from among a group of data consisting of a first predetermined number of measured data which is greater than the second predetermined number, in the order in which extracting priority is given over smaller mutual differences. The MPU 20, ROM 21, and RAM 35 constitute an example of a mean-value calculating means for calculating a mean value of the extracted measured data extracted by the extracting means. It should be noted that the above group of data is updated, with the oldest measured data (having the longest lapse time since it was measured) replaced with newly obtained data, each time the sensitivity measuring means makes measurements.

The noise eliminating operation is now discussed. FIG. 8 is a flowchart showing an example of a noise eliminating operation in the embodiment. The program of noise eliminating operation is stored in RAM 31.

In the noise eliminating operation, from among three individual measured pieces of data, any two individual measured pieces of data are extracted which have a smaller mutual difference than either one between each of the two and the third individual measured piece of data. The extracted two pieces of data are then averaged, and the resulting average is used as a measured piece of data free from noise components in the course of the measurement process.

At step SB1, the initial setting is performed, such as setting the count value of the timer TM1 to its initial state. When the passage of the time set in the timer TM1 is recognized at step SB2, the A/D converter 41 is actuated, and its output signal (measured data) is stored at the address [*+0] in RAM 31 at step SB3.

At step SB4, measured data stored in RAM 31 is internally shifted. Specifically, data D(*+2) at address [*+2] is shifted to address [*+3], data D(*+1) at address [*+1] to address [*+2], data D(*+0) at address [*+0] to address [*+1]. Address [*+2] is an address two locations ahead of address * and address * is a leading address where measured data and the like are stored.

Data D(*+3), data D(*+2) and data D(*+1) are identified as the above-described three measured data.

When the number of the measured data is judged less than 3 at step SB5, the sequence returns to the step SB2, and waits until all three measured pieces of data are provided. When all three measured pieces of data are provided, the mutual differences between three measured pieces of data are calculated at step SB6, and the resulting differences are stored in RAM 31.

Specifically, the MPU 20 calculates the absolute value of the difference between data D(*+1) and data D(*+2), and stores the result in the address [*+4] in RAM 31. The MPU 20 calculates the absolute value of the difference between data D(*+2) and data D(*+3), and stores the result in the address [*+5] in RAM 31. Further, the MPU 20 calculates the absolute value of the difference between data D(*+3) and data D(*+1), and stores the result in the address [*+6] in RAM 31.

Any two measured pieces of data which results in the smallest difference are selected and averaged. The resulting averaged measured data is designated $D_A$, which is then stored in RAM 35. Specifically, if data D(*+4) is judged equal to or smaller than data D(*+5) at step SB7, and if data D(*+4) is judged equal to or smaller than data D(*+6) at step SB8, measured data D(*+1) and measured data D(*+2) are averaged at step SB9. The resulting averaged data $D_A$ is stored in RAM 35 at step SB13. If data D(*+4) is judged equal to or smaller than data D(*+5), and if data D(*+4) is judged greater than data D(*+6), measured data D(*+1) and measured data D(*+3) are averaged at step SB10. The resulting averaged data $D_A$ is stored in RAM 35 at step SB13. If data D(*+4) is judged greater than data D(*+5) at step SB7, and if data D(*+5) is judged equal to or smaller than data D(*+6) at step SB11, measured data D(*+2) and measured data D(*+3) are averaged at step SB12. The resulting averaged data $D_A$ is stored in RAM 35 at step SB13. When the storage of the averaged measured data $D_A$ in RAM 35 is complete, the sequence returns to step SB2 for waiting for another measured data.

In the above embodiment, the sensitivity of the fire detector is determined, based on the measured data which is provided as a result of measurement of the output of the fire detector at each predetermined time period, a few seconds, for example. From among a group of a plurality of pieces of measured data, measured data are extracted in the order in which priority is given over the smaller mutual difference, extracted measured data are averaged, and consequently the sensitivity measuring means judges the sensitivity on the basis of the resulting average. Thus, even when external noise, superimposed on the detector output signal and along with the detector output signal, is applied to the sensitivity measuring means, or even when external noise singly comes in to the sensitivity measuring means, that external noise may be eliminated. The sensitivity measuring apparatus may stay free from an erratic measurement which would be attributable to external noise.

Each time new measured data is obtained at step SB4, that newly measured data is included in the group of data, and of the data in the group, the oldest measured data from the time of measurement is removed from the group. Thus, the sensitivity measurement is performed on the basis of constantly updated data collection.

In the embodiment, of the three individual pieces of measured data, the two having the smaller mutual difference are extracted. The two extracted pieces of data are averaged. The resulting average is considered noise-free measured data, and is used for the sensitivity determination process. Alternatively, the selection process may be made on more than three individual pieces of data, and three or more pieces of data having a smaller mutual difference may be selected. The timer TM1 is used to activate the measurement of the fire detector output signal in the embodiment. Alternatively, each time the output signal (pulsed signal) is received from the fire detector, that output signal (pulsed signal) may be measured. The calibration of the measured data is made when they are read. Alternatively, the calibration may be made after the average value is determined.

Figure 9:
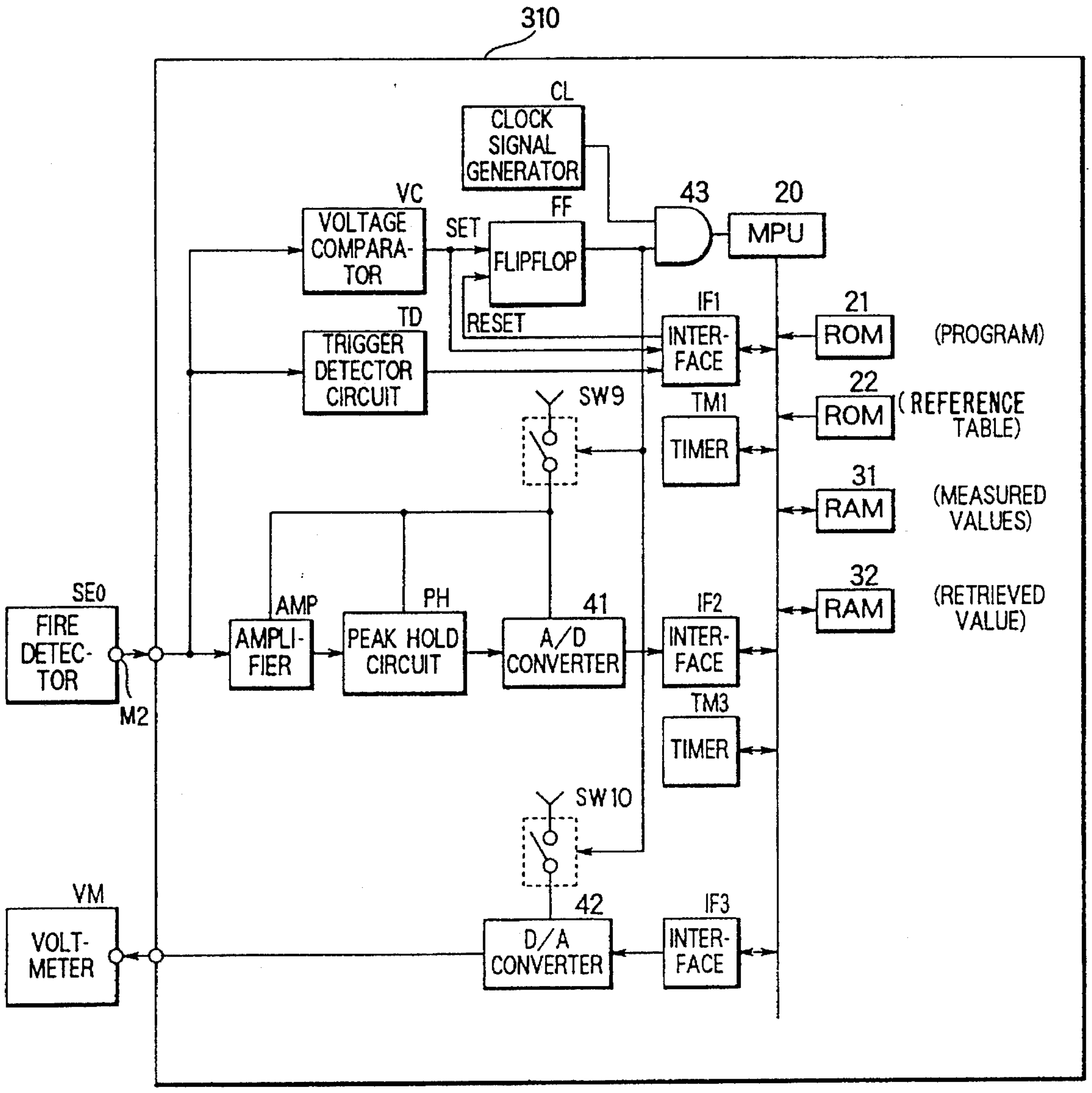
FIG. 9 is a block diagram corresponding to part of the block diagram of FIG. 1 related to an auto power on-off operation in the embodiment of the present invention.

FIG. 9 is a block diagram of part of the block diagram of FIG. 1 related to auto power on-off operation. In this operation, the supply of power or clock pulses to the circuitry of the sensitivity measuring apparatus is stopped when no signal is received from the fire detector for a predetermined time period, or the supply of power or clock pulses to the circuitry of the sensitivity measuring apparatus is started when the signal is received from the fire detector. Part of the sensitivity measuring apparatus 10 needed for the power on-off operation is referred to as sensitivity measuring apparatus 310.

In FIG. 9, the sensitivity measuring apparatus 310 comprises the MPU (microprocessor unit) 20 which controls the entire operation of the sensitivity measuring apparatus 310, the ROMs 21 and 22, the RAMs 31 and 32, an amplifier AMP for amplifying the signal from the fire detector SEo, a peak hold circuit PH for holding peak values of the output signal of the amplifier AMP, an A/D converter 41 for converting an analog signal into a digital signal, a D/A converter 42 for converting a digital signal into an analog signal, a timer TM1 for determining the read-in period in which the signal from the fire detector is read, a timer TM3 which determines the timing of stopping the supply of power or clock pulses to the circuitry of the sensitivity measuring apparatus 310 from the moment no signal was received from the fire detector, a trigger detecting circuit TD, a voltage comparator VC, a clock signal generator CL, a flipflop FF, and a switch SW9 for controlling the supply of power to the amplifier AMP, the peak hold circuit PH and the A/D converter 41, and a switch SW10 for controlling the supply of power to the D/A converter 42.

The ROM 21 stores a program of which flowchart is shown in FIG. 3. The ROM 22 stores a table indicating the correspondence between the output signal value of the fire detector SEo and the sensitivity value of the fire detector SEo.

The RAM 31 stores the digital value of the output signal of the fire detector SEo. The RAM 32 stores the retrieved sensitivity value obtained on the basis of the output signal of the fire detector SEo (the sensitivity value converted from the output value of the fire detector SEo).

The voltage comparator VC detects the reception of output signal of the fire detector SEo. Specifically, the voltage comparator VC compares the output signal of the fire detector SEo with a comparison threshold level, and provides an detection output signal when the level of the detector output signal is higher than the comparison threshold level. The flipflop FF is designed to receive at its set terminal the detection output signal from the voltage comparator VC, and at its reset terminal the signal indicating that the time T set in the timer TM3 has elapsed. Then, the flipflop FF begins outputting a High signal at the moment it receives the output signal of the fire detector SEo and ends the output of the High signal at the moment the time T set in the timer TM3 has elapsed after the reception of the output signal of the fire detector SEo.

The voltage comparator VC is an example of the signal detecting means for detecting the output signal from the fire detector. The trigger detecting circuit TD, the flipflop FF, the clock signal generating circuit CL, MPU 20, ROM 21, switches SW9 and SW10 constitute an example of signal stop means. The signal stop means stops the supply of power to the internal circuitry of the sensitivity measuring means or the supply of clock pulses to the internal circuitry of the sensitivity measuring means, in case no output signal is received from the fire detector during a predetermined time period. The trigger detector circuit TD, the flipflop FF, the clock generator CL, MPU 20, ROM 21, switches SW9 and SW10 constitute an example of the supply start means. The supply start means starts the supply of power to the internal circuitry of the sensitivity measuring means or the supply of clock pulses to the internal circuitry of the sensitivity measuring means, when the output signal of the fire detector is received. The internal circuitry of the sensitivity measuring apparatus is at least one of the following means: an analog signal processing means which performs at least one of the three functions of the signal impedance matching function, amplifying function and signal holding function, an A/D converting means for converting the analog output signal provided by the analog signal processing means into a digital signal, and a digital signal processing means for processing the digital signal provided by the A/D converting means, a D/A converting means for converting the digital signal into an analog signal, a numerical data indicating means, a and state indicating means.

Figure 10:
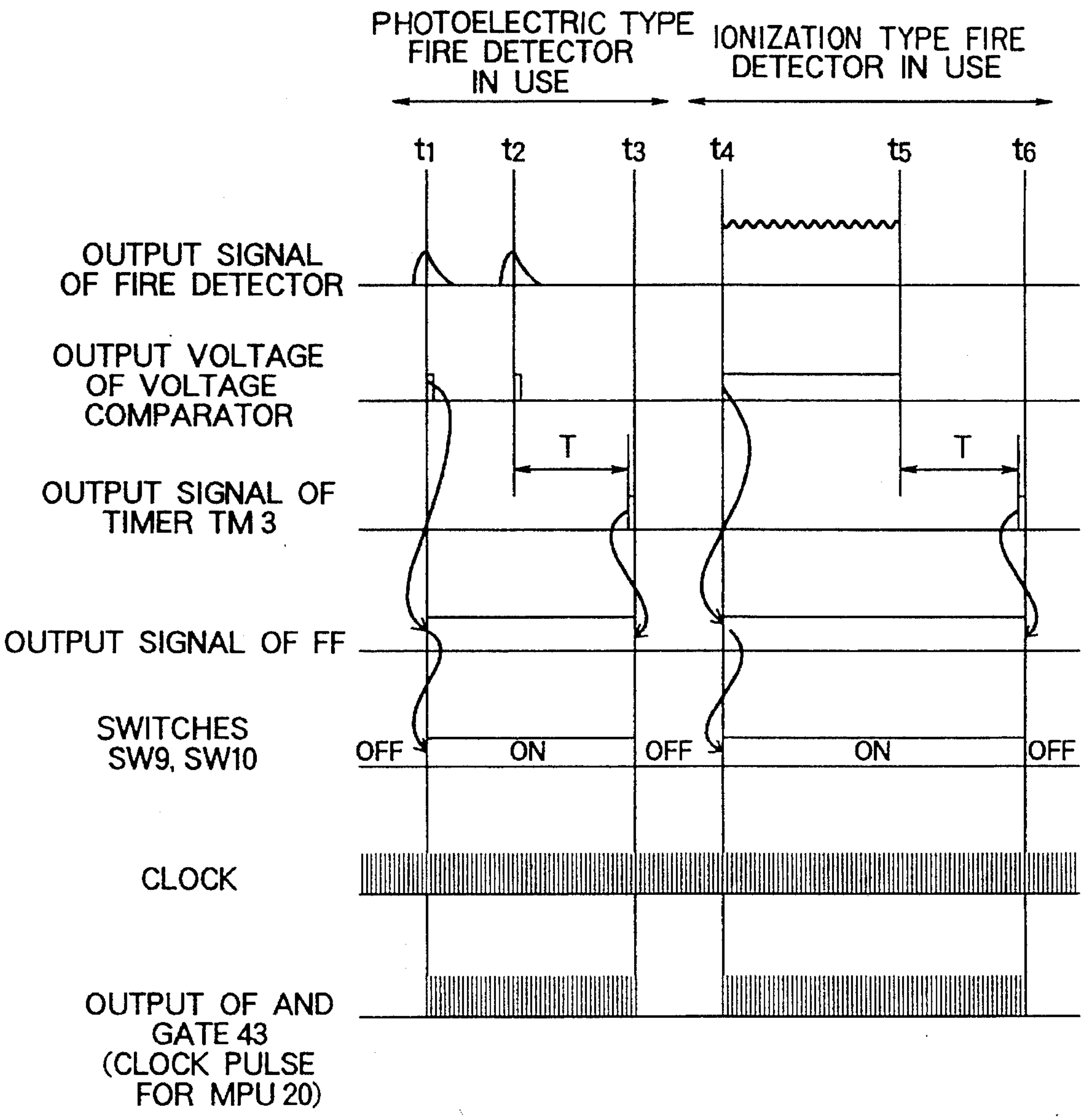
FIG. 10 is a time chart illustrating the auto power on-off operation.

The auto power on-off operation is now discussed. FIG. 10 is a time chart showing the auto power on-off operation.

As seen from FIG. 9, the photoelectric type fire detector SEo is connected to the sensitivity measuring apparatus 310. In the photoelectric type fire detector SEo, when the light emitting element L emits pulsed light, the light receiving element PD detects reflected light from the inner walls, and provides a light-driven output. That pulsed signal output is sent to the sensitivity measuring apparatus 310. When the photoelectric type fire detector SEo outputs the pulsed signal at time t1 in FIG. 10, the voltage comparator VC compares the input pulsed signal with the comparison threshold level. The voltage comparator VC outputs the High signal for the duration in which the pulsed signal level remains higher than the comparison threshold level. This allows a trigger to be applied to the timer TM3, thereby causing the timer TM3 to start to count-up. The flipflop FF is set at the moment the voltage comparator VC outputs the High signal, and thus the flipflop FF outputs a High output. This causes both switches SW9 and SW10 to be switched on, thereby allowing power to be applied to the amplifier AMP, the peak hold circuit PH, the A/D converter 41, and the D/A converter 42.

The High output of the flipflop FF causes the AND gate 43 to open, and thus the clock signal generator CL starts feeding a clock signal to the MPU 20, causing it to operate.

If the photoelectric type fire detector SEo outputs the next pulsed signal at time t2 before the time T set in the timer TM3 has elapsed (the time difference between t1 and t2 is shorter than time T for the timer TM3), the voltage comparator VC again outputs a pulsed signal which then again re-triggers the timer TM3. The timer TM3 then starts counting for the time T.

On the other hand, if the time T set has elapsed (at t3) before the voltage comparator VC outputs the next pulsed signal, then the timer TM3 outputs an count end signal. The count end signal resets the flipflop FF, switching off SW9 and SW10, and stopping the supply of power to the amplifier AMP, the peak hold circuit PH, the A/D converter 41 and the D/A converter 42. Since the flipflop FF remains reset, the AND gate 43 is closed, thereby causing the clock signal generator CL to stop feeding the clock signal to the MPU 20. The operation of the MPU 20 stops. As an alternative to the AND gate 43, the stop and start of the supply of clock signal by the clock signal generator CL to the MPU 20 may be controlled by the start and stop of the supply of power to the clock signal generator CL by means of the output of the flipflop FF.

In the embodiment shown in FIG. 9, the supply of power to the internal circuitry of the sensitivity measuring apparatus is stopped or the supply of the clock signal to the internal circuitry of the sensitivity measuring apparatus is stopped when no output signal from the fire detector is received for the predetermined time period, for example, when the fire detector remains unconnected, a useless discharge of the internal batteries due to inadvertently forgotten switch-off of the power may be avoided. As long as the output signal from the fire detector is received, power is not switched off. This does not require power-on operation every predetermined time, the simplifying the power-on/off manipulation.

When the photoelectric type fire detector SEo is afterwards connected to the sensitivity measuring apparatus 310, the flipflop FF is set at the timing t1 as already described, both switches SW9 and SW10 are automatically switched on. The amplifier AMP starts operating, and clock signal is fed to the MPU 20, causing it to automatically operate. In this way the manipulation of the power switch is easy in this embodiment.

Shown at times t4 to t6 in FIG. 10 are a time chart for the operation of the sensitivity measuring apparatus which is connected to the ionization type fire detector SEi. The sensitivity measuring apparatus needs no peak hold circuit PH because the ionization type fire detector SEi outputs a DC signal. In principle, the operation of the sensitivity measuring apparatus connected to an ionization type fire detector SEi is the same as that of the sensitivity measuring apparatus connected an photoelectric type fire detector SEo. Once the fire detector starts outputting the output signal at time t4, it continues to output the signal until time t5 at the moment the connection of the fire detector is set open. Throughout this duration, the timer TM3 is continuously triggered. At time t5, the timer TM3 starts counting time T. At time t6 the timer T has elapsed, the flipflop FF is reset, causing switches SW9 and SW10 to be switched off. Then, the supply of power to the amplifier AMP, the peak hold circuit PH, the A/D converter 41, the D/A converter 42 is stopped. The AND gate 43 is closed, stopping the supply of the clock signal from the clock signal generator CL to the MPU 20. The MPU 20 thus stops its operation.

Figure 11:
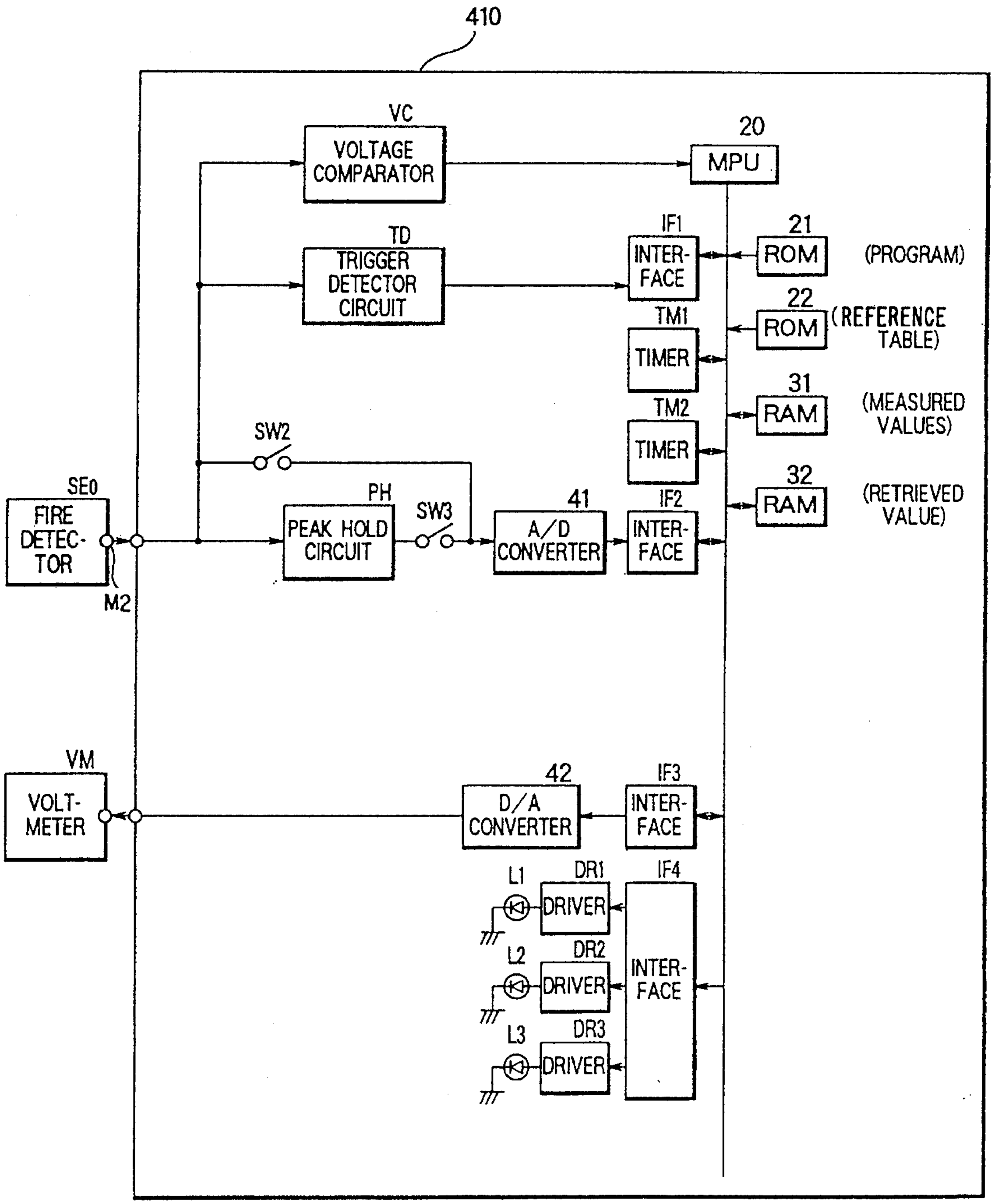
FIG. 11 is a block diagram corresponding to part of the block diagram of FIG. 1 related to a type identification operation in the embodiment of the present invention.

To stop the supply of power to the amplifier AMP, the A/D converter 41, and the D/A converter 42, the main supply to each of these circuits may be switched off. Alternatively, only the reference voltage supply for each of the amplifier AMP, the A/D converter 41 and the D/A converter 42 may be switched off. FIG. 11 is a block diagram of part of the block diagram of FIG. 1 related to fire detector type identification operation in the embodiment of the present invention. Part of the sensitivity measuring apparatus 10 required for the operation of the type identification is designated as the sensitivity measuring apparatus 410.

The sensitivity measuring apparatus 410 in FIG. 11 comprises an MPU 20 which controls the entire operation of the sensitivity measuring apparatus 410, ROMs 21 and 22, RAMs 31, and 32, an A/D converter 41 for converting an analog signal into a digital signal, a D/A converter 42 for converting a digital signal into an analog signal, timers TM1 and TM2, interfaces IF1, IF2, IF3, and IF4, display drivers DR1, DR2, and DR3, LED indicators L1, L2 and L3, a peak hold circuit PH for holding peak values of the output signal of the fire detector SEo, a trigger detecting circuit TD, a voltage comparator VC and switches SW2 and SW3.

Figure 12:
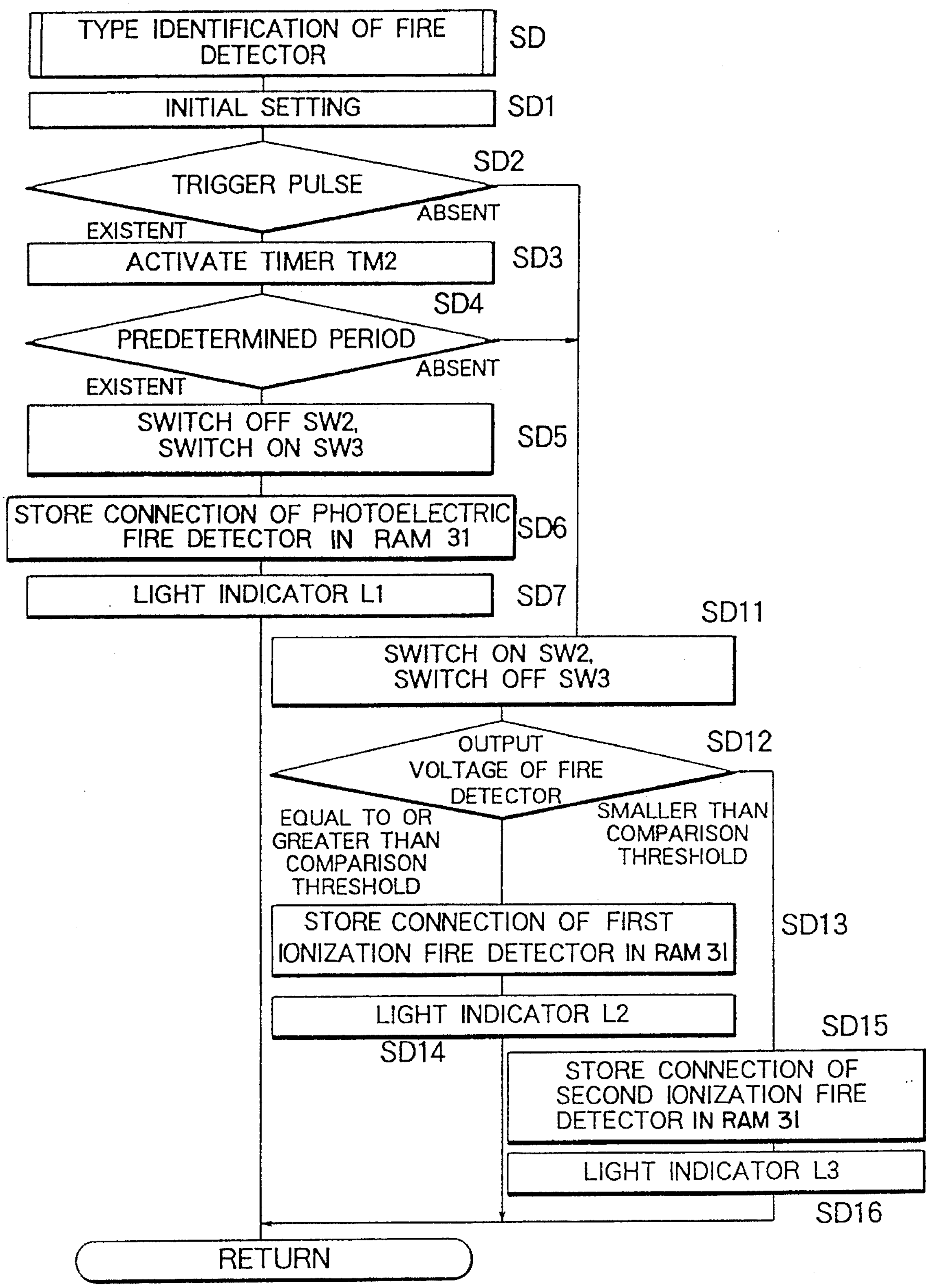
FIG. 12 is a flowchart describing an example of the type identification operation.

The ROM 21 stores a program whose flowchart is shown in FIG. 3. The ROM 21 also store's a program whose flow chart is shown in FIG. 12. The ROM 22 stores a plurality of reference tables corresponding to a plurality of types of fire detectors. Each reference table lists the output signal value of the corresponding fire detector versus the sensitivity value of the fire detector.

The RAM 31 stores the digital value of the output signal of the fire detector. RAM 32 stores the retrieved sensitivity value obtained on the basis of the output signal of the fire detector (the sensitivity value converted from the output value of the fire detector). The A/D converter 41 converts the analog output signal of the fire detector into a digital signal. The D/A converter 42 converts the retrieved digital signal into an analog signal.

The timer TM1 determines the read-in period during which the output of the fire detector is read. The timer TM2 is used to determine the type of a fire detector, wherein the time set in the timer TM2 agrees with the period of the output pulse of a photoelectric type fire detector.

The LED indicator L1 indicates that a photoelectric type fire detector SEo is connected to the sensitivity measuring apparatus 410. The LED indicator L2 indicates that a first ionization type fire detector is connected to the sensitivity measuring apparatus 410. The LED indicator L3 indicates that a second ionization type fire detector is connected to the sensitivity measuring apparatus 410. The DR1, DR2, and DR3 drive respectively drive the LED indicators L1, L2, and L3.

The switch SW2 is switched on when sensitivity measurements of the ionization type fire detector SEi are effected. The SW3 is switched on when sensitivity measurements of the photoelectric type fire detector SEo are effected.

The trigger detector circuit TD detects trigger pulses out of the output signal of the fire detector to determine if the output signal of the fire detector is periodic. The voltage comparator VC compares the output signal of the fire detector with a predetermined comparison threshold level to determine whether the connected ionization type fire detector is the first ionization type fire detector or the second ionization type fire detector.

The MPU 20, ROM 21, ROM 22, the timer TM2, the trigger detecting circuit TD, and the voltage comparator VC constitute an example of the type identifying means which determine the type of the fire detector.

FIG. 12 is a flowchart showing the operation of the type identification, in the above embodiment.

Figure 13A:
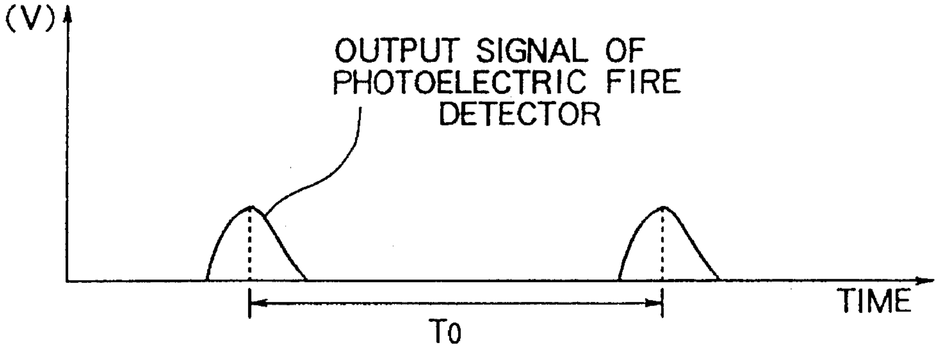
FIG. 13A through FIG. 13C show the output signal waveform of the photoelectric type fire detector, the output signal waveform of the ionization type fire detector and the output signal characteristic of the ionization type fire detector, respectively.

At step SD1, the initial setting is performed, and the fire detector is connected to the sensitivity measuring apparatus 410 (the ionization type fire detector SEi is connected in FIG. 11), and switches SW2 and SW3 are switched off. At step SD2, the trigger detecting circuit TD detects trigger pulses out of the output signal of the fire detector. At the moment the trigger detecting circuit TD detects trigger pulses, the timer TM2 is actuated at step SD3. If the detected trigger pulses are of a predetermined period, the connected detector is judged to be the photoelectric type fire detector at step SD4. Specifically, if a trigger pulse is detected every duration of T0 as shown in FIG. 13A, the trigger pulses have the period T0. T0 is a predetermined period of time.

When the connected fire detector is judged to be a photoelectric type fire detector, at step SD5 the MPU 20 switches on SW3 with SW2 left switched off, the peak hold circuit PH holds peak values of the output signal of the fire detector, the peak values (analog values) are prepared for conversion to a digital signal by the A/D converter 41. To prepare for a sensitivity retrieval operation later, the information that the photoelectric type fire detector is now connected is saved in RAM 31 at step SD6. At step SD7, the indicator lamp L1 is turned on to indicate that the photoelectric type fire detector is connected. Then, the sequence returns.

Figure 13B:
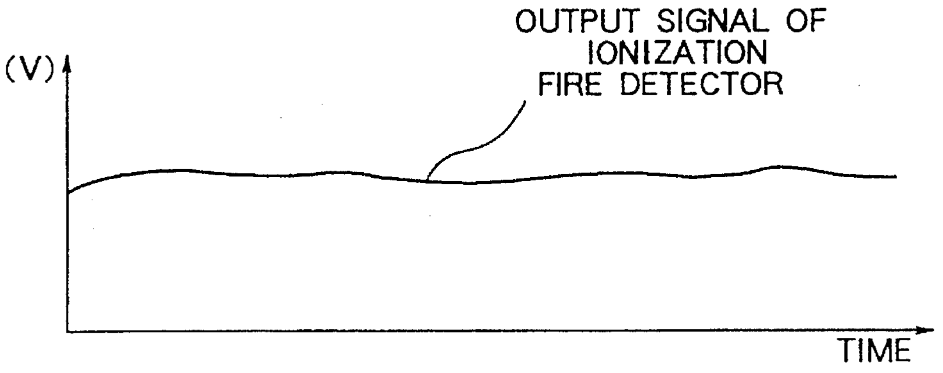

On the other hand, if no trigger pulses are detected out of the output signal of the fire detector at step SD2, or if the period of the trigger pulses are judged to be different from the predetermined period even if the trigger pulses are detected in the output signals of the fire detector at step SD4, the connected fire detector is judged to be an ionization type fire detector because the ionization type fire detector gives an output having mainly DC components as shown in FIG. 13B.

Figure 13C:
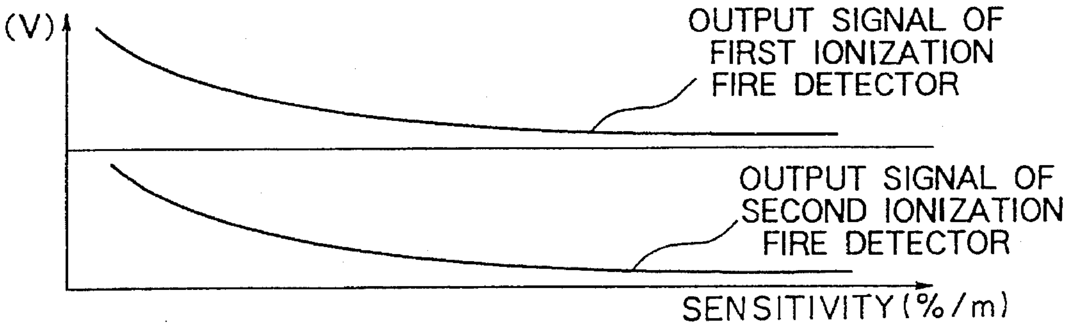

If the connected fire detector is judged to be an ionization type fire detector, switch SW2 is switched on with SW3 left switched off at step SD11, and the output signal of the fire detector is directly applied to the A/D converter 41 bypassing the peak hold circuit PH. At step SD12, the voltage comparator VC compares the output signal of the ionization type fire detector with a predetermined comparison threshold level. When the output signal of the ionization type fire detector is higher than the predetermined comparison threshold level, the connected fire detector is judged to be a first ionization type fire detector, and at step SD13 the information that the first ionization type fire detector is now connected is stored into RAM 31 in preparation for later sensitivity value retrieval operation. At step SD14, the indicator lamp L2 is turned on to indicate the first ionization type fire detector is connected. The sequence then returns. The first ionization type fire detector and the second ionization type fire detector are identified by the difference in their output signals as shown in FIG. 13C.

At step SD12, when the output signal of the ionization type fire detector is smaller than the predetermined comparison threshold level, the connected ionization type fire detector is judged to be the second ionization type fire detector. At step SD15, the information that the second ionization type fire detector is connected is saved in RAM 31 in preparation for later sensitivity value retrieval operation. At step SD16, the indicator lamp L3 is turned on to indicate that the second ionization type fire detector is connected. Then, the sequence returns.

In the above embodiment, the type of the fire detector is identified on the basis of the output signal of the fire detector. This eliminates the possibility of erroneous sensitivity measurement due to the wrong recognition of type identification of the fire detector.

In the above embodiment, the period of the output signal of the fire detector is detected, and the type of the fire detector is identified based on the detected period. Alternatively, the signal output duration may be detected, and the type of the fire detector may be identified by the signal output duration.

In the above embodiment, indicating means such as LED indicators or the like are used to indicate what type of fire detector is connected. This indicating means may be omitted. Alternatively, sound output means may be used to output the result of type identification.

Figure 14:
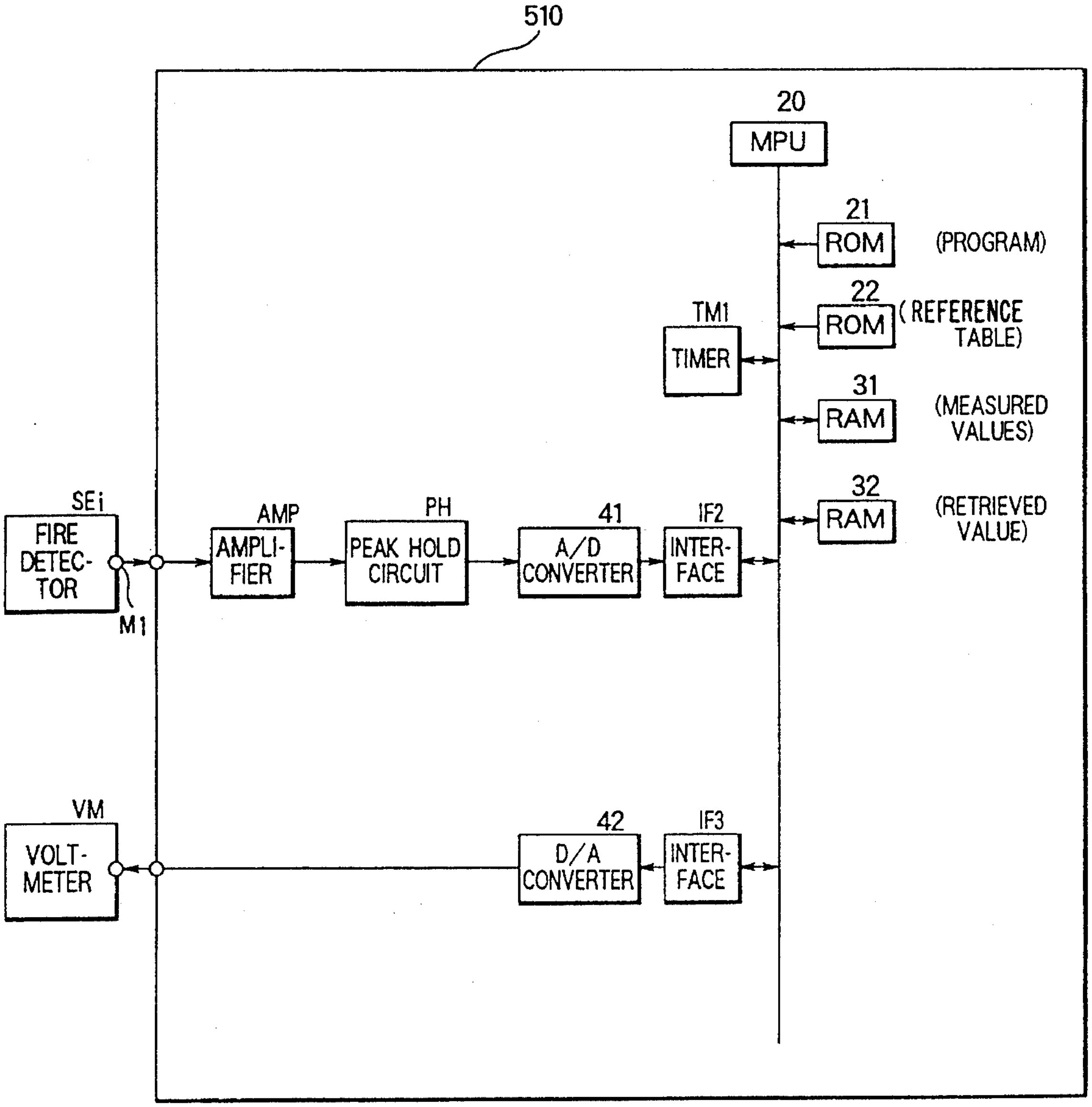
FIG. 14 is a block diagram corresponding to part of the block diagram of FIG. 1 related to a sensitivity retrieval operation.

FIG. 14 is a block diagram corresponding to part of the block diagram of FIG. 1 related to sensitivity value retrieval operation in which the corresponding sensitivity value is retrieved on the basis of the output signal of the fire detector from the memory that stores the correspondence between the output signal value of the fire detector and the sensitivity value of the fire detector. The part of the sensitivity measuring apparatus 10 is here designated as sensitivity measuring apparatus 510.

The sensitivity measuring apparatus 510 shown in FIG. 14 comprises an MPU 20 which controls the entire operation of the sensitivity measuring apparatus 510, ROMs 21 and 22, RAMs 31, and 32, the amplifier AMP for amplifying the output signal of the fire detector SEi, a peak hold circuit PH, an A/D converter 41 for converting an analog signal into a digital signal, a D/A converter 42 for converting a digital signal into an analog signal, a timer TM1, and interfaces IF2 and IF3.

Figure 15:
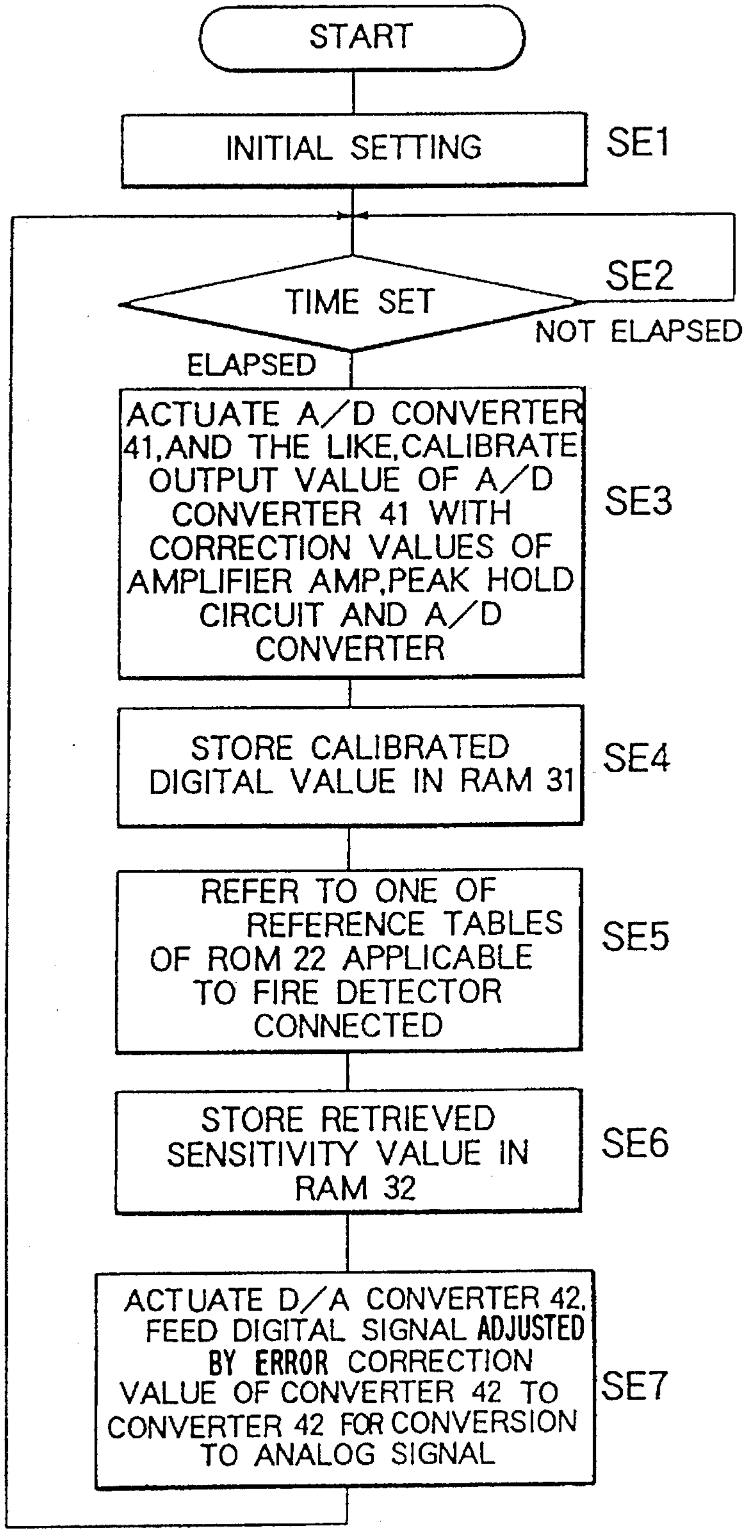
FIG. 15 is a flowchart describing the sensitivity retrieval operation.

The ROM 21 stores a program whose flowchart is shown in FIG. 3. The ROM 21 also stores a program whose flow chart is shown in FIG. 15. The ROM 22 stores the correspondence between the output signal value of the fire detector SEi and the sensitivity value of the fire detector SEi. As shown in FIG. 16, for example, the output signal values (A/D converted digital values) are associated to the addresses of ROM22, with each address having as its respective data sensitivity value. In FIG. 16, A/D converted values (addresses of ROM22) and data in ROM22 make up the content of ROM22, and this is a reference table which lists the output signal values of the fire detector versus the sensitivity values of the fire detector. Each increment of the address of ROM22 is determined to indicate an increase in the output voltage of the fire detector SEi by 0.02 volts. In FIG. 16, address 00000000 is a leading address of the reference table. The leading address may be assigned to some other location in the memory.

In the reference table stored in ROM 22, the sensitivity value of the fire detector SEi may be replaced by a correlative value which has a linear relationship with the sensitivity value of the fire detector SEi to represent the output signal values of the fire detector SEi. The ROM 22 is an example of memory means which stores a correspondence between the output signal value of the fire detector and the sensitivity value of the fire detector or the correlative value having a linear relationship with the sensitivity value. The correlative value having a linear relationship with the sensitivity value may be described later.

The RAM 31 stores the digital value of the output signal of the fire detector SEi. The RAM 32 stores the retrieved sensitivity value obtained on the basis of the output signal of the fire detector (the sensitivity value converted from the output value of the fire detector). The A/D converter 41 converts the analog output signal of the fire detector SEi into a digital signal. The D/A converter 42 converts the digital signal which is the retrieved sensitivity value into an analog signal.

The MPU 20 and ROM 21 constitute an example of retrieval means which retrieves from the memory means the sensitivity values or the correlative values on the basis of the output signal values of the fire detector.

The sensitivity value retrieval operation is now described. FIG. 15 is a flowchart illustrating the sensitivity value retrieval operation in the embodiment.

At step SE1, the initial setting is performed. When the time set in the timer TM1 is judged to have elapsed at step SE2, the A/D converter 41 and the like are actuated at step SE3. Also, at step SE3, the output signal of the fire detector is converted into a digital signal, while the output of the A/D converter 41 is at the same time corrected or calibrated with each correction value of the amplifier AMP, the peak hold circuit PH and the A/D converter 41 with respect to the A/D converter. The calibrated digital data are stored in the RAM 31 at step SE4. At step SE5, the sensitivity value corresponding to stored digital signal value is retrieved from one of the reference tables in the ROM 22 which is applicable to the type of the fire detector connected. Namely, the output signal value of the fire detector SEi is converted to the sensitivity value. The sensitivity value retrieved in this way is stored in the RAM 32 at step SE6. At step SE7, the D/A converter 42 is activated, and the digital signal which has been adjusted by the error-correction value of the D/A converter 42 is supplied to the D/A converter 42, and thus the retrieved sensitivity value is converted into an analog signal and sent to the voltmeter VM.

Figure 17:
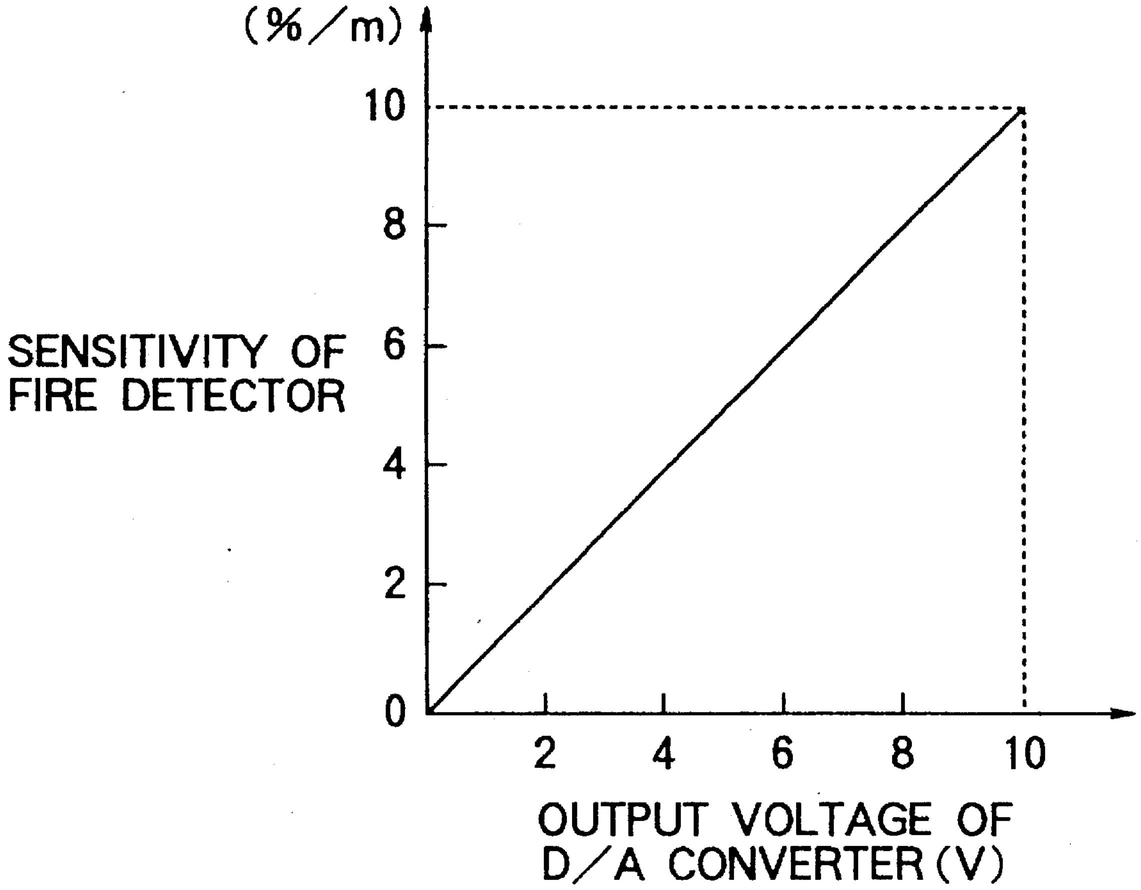
FIG. 17 is a graph illustrating the relationship between the output voltage of a D/A converter 42 and the sensitivity of a smoke detector.
Figure 18:
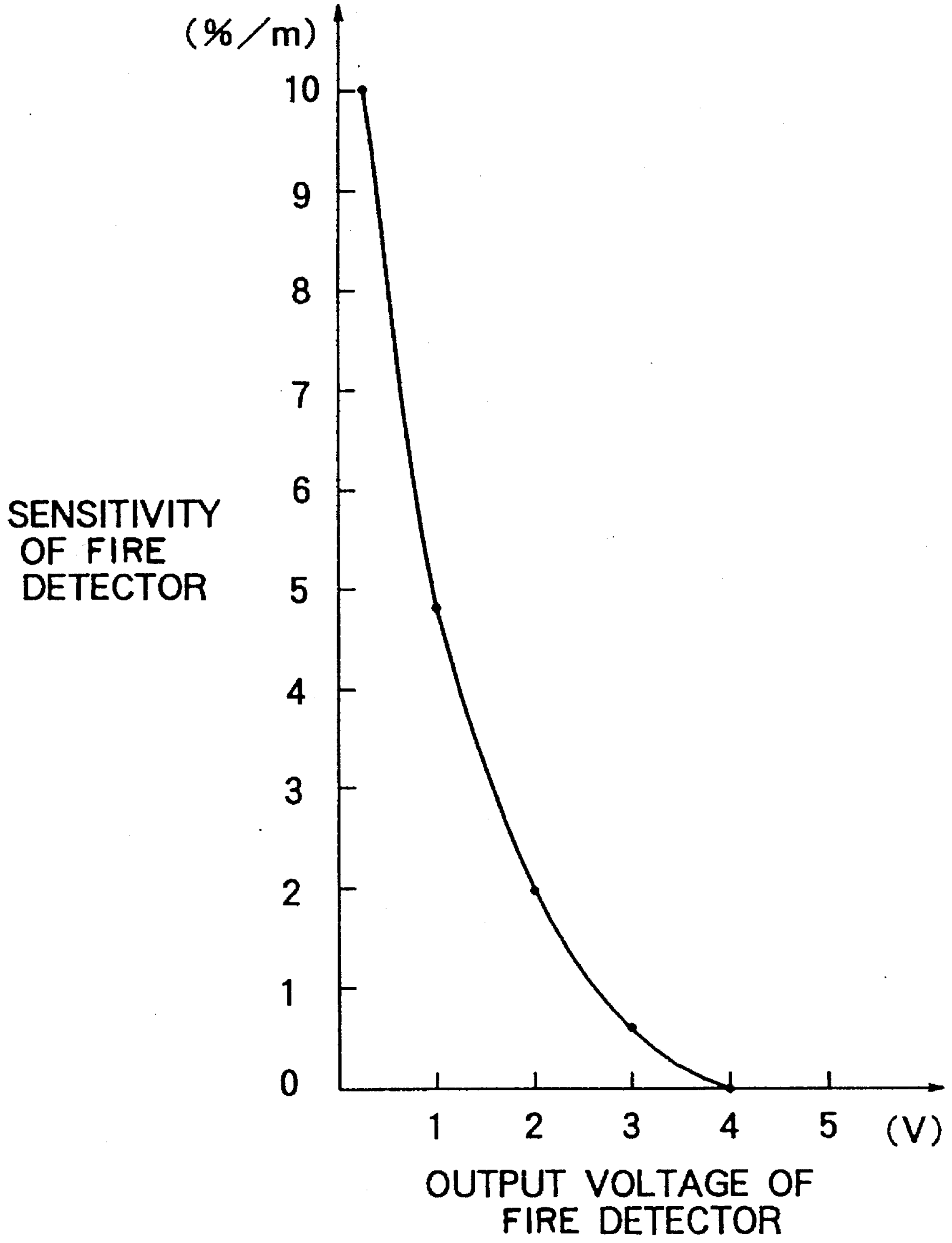
FIG. 18 is a graph illustrating the relationship between the output voltage of the fire detector SEi and the sensitivity of the fire detector SEi.

The voltmeter VM indicates the sensitivity value in units of volts. When inspectors thus observe the voltmeter VM, they can easily recognize the sensitivity by simply reading the voltage as %/m on the scale. This allows the inspectors to easily and quickly recognize the sensitivity value. Namely, in the embodiment, even if the relationship between the output voltage of the fire detector SEi and the sensitivity value of the fire detector SEi is non-linear as shown in FIG. 18, with the fire detector SEi placed in a smoke density of 0%/m, the relationship between the output voltage of the D/A converter 42 (the output voltage of the sensitivity measuring device 510) and the sensitivity value of the fire detector is linear as shown in FIG. 17. The inspectors can quickly recognize the sensitivity value at a glance using the voltmeter VM. The "sensitivity" of the fire detector SEi indicates how much increase in smoke density (%/m) around the fire detector SEi is required to activate a switching circuit SWC1 for alarming from the initial smoke density of 0%/m around the fire detector SEi. The sensitivity of the fire detector varies with level of dirt in the ionization chamber ICM. In the above embodiment, the sensitivity of the fire detector SEi increases, i.e., the fire detector is triggered by lower level of smoke density, as the level of dirt inside the ionization chamber ICM increases. Similarly, the photoelectric type fire detector become more sensitive as dirt deposits more in the dark chamber of the detector.

The above term "correlative value having a linear relationship with the sensitivity value" means correlative values from which the ordinary person can easily obtain corresponding sensitivity values by mental calculations: assuming that the sensitivity values are 1, 2, 3, . . . %/m, correlative values can be obtained by multiplying the sensitivity values by $10^n$ (n is any integer other than 1), for example, 0.1, 0.2, 0.3, . . . , or 10, 20, 30, . . . , or correlative values can be obtained by adding some simple integer n to the sensitivity values, for example, 3, 4, 5, . . . (n is 2 in this case).

In the above embodiment, the unit of sensitivity is [%/m]. It is assumed that the unit of the output signal of the fire detector is [V]. When the fire detector SEi outputs YYY [V] corresponding to sensitivity XXX [%/m] of the fire detector SEi, inspectors may directly take the reading YYY [V] on the voltmeter VM as the sensitivity value. In this case, the unit of the output signal of the fire detector SEi may be [mV], [A], [mA] and the like instead of [V]. As an alternative to the unit of sensitivity [%/m], [%/foot] may be substituted. Furthermore, an ammeter or the like may be substituted for the voltmeter VM. In these arrangements, the inspectors may recognize the reading directly as the sensitivity value. If YYY [unit of the output of the fire detector] corresponding to XXX [unit of sensitivity] is output, the reading the inspectors observe on the meter may be directly recognized as the sensitivity value.

Instead of the ionization type fire detector SEi, an photoelectric type fire detector SEo may be connected to the sensitivity measuring apparatus 510 as shown in FIG. 2B to measure the sensitivity of the photoelectric type fire detector SEo. The sensitivity of the photoelectric type fire detector SEo may be handled in a similar manner as that of the above ionization type fire detector SEi.

In the sensitivity measuring apparatus 510 as shown in FIG. 14, indicators lamp may be incorporated to indicate that the,sensitivity value retrieved is normal (or abnormal). The indicator lamps may be made up of one LED lamp for indicating the sensitivity value above or below a predetermined value, or one LED lamp for indicating the sensitivity value falling within or outside a predetermined range. As an alternative to LED indicators, speech synthesizing means which synthesizes speech, for example, telling "normal sensitivity" or "abnormal sensitivity" may be used. Alternatively, sound output means such as a loudspeaker and a buzzer may be used. In the sensitivity measuring apparatus 510, an indicator lamp which indicates actually retrieved sensitivity value may be incorporated.

Although the above embodiment throughout has been described assuming that the sensitivity of the fire detector is measured with the fire detector detecting the smoke of a smoke density of 0%/m, the above description may be equally applicable to the sensitivity measurement of the fire detector which detects the smoke of a predetermined smoke density other than 0%/m.

In the above embodiment, a smoke fire detector such as the ionization type fire detector SEi or the like is connected to the sensitivity measuring apparatus 510. Fire detectors having non-smoke triggered sensors, such as ultraviolet type fire detectors or infrared type fire detectors, may be connected to the sensitivity measuring apparatus 510 to measure their sensitivity.

The above embodiment is applied to the sensitivity measuring apparatus in which the sensitivity value of the fire detector is retrieved according to the output signal of the fire detector. The above embodiment may be applied to a sensitivity measuring apparatus which allows the output signal value of the fire detector to directly be output (without any conversion to sensitivity value), or a sensitivity measuring apparatus which has only a single function which gives only the indication of normal or not normal fire detector in response to the output signal value of the fire detector.

In FIG. 7 thereafter, for convenience, no explanation has been provided for the calibrating operation of the measured values. The measured values may be calibrated in any appropriate time in the course of signal processing of the read measured values.

What is claimed is:

1. A sensitivity measuring apparatus which is connected to a fire detector for measuring the fire detector sensitivity, said sensitivity measuring apparatus comprising:

a sensitivity measuring means for receiving an output signal of the fire detector so as to measure the sensitivity of the fire detector;

a reference signal generating means for generating a reference signal for calibration of the apparatus; and a calibrating means for calibrating the sensitivity measuring apparatus on the basis of the reference signal generated by the reference signal generating means.

2. The apparatus according to claim 1, wherein said sensitivity measuring means comprises:

an analog signal processing means for processing an analog signal which is said output signal from the fire detector;

an A/D converter means for receiving and converting the analog signal processed by the analog signal processing means into a digital signal; and a digital signal processing means for receiving and processing the digital signal converted by the A/D converter means.

3. The apparatus according to claim 2, wherein said calibrating means includes means for calibrating the digital signal which is output from the A/D converter means to the digital signal processing means in the sensitivity measuring means.

4. The apparatus according to claim 2, wherein said analog signal processing means performs at least one of the three functions of an impedance matching function for the signal, an amplifying function of the signal and a signal holding function.

5. The apparatus according to claim 1, wherein said sensitivity measuring means comprises a sensitivity output means for outputting measured sensitivity values, and wherein said calibrating means calibrates said sensitivity output means on the basis of the reference signal generated by the reference signal generating means.

6. The apparatus according to claim 5, wherein said sensitivity output means comprises:

a D/A converting means for converting a digital signal into an analog signal; and a digital signal processing means for receiving and processing the digital signal input to the D/A converting means.

7. The apparatus according to claim 6, wherein said calibrating means includes means for calibrating the digital signal output from the digital signal processing means to the D/A converting means in the sensitivity output means.

8. The apparatus according to claim 5, further comprising a signal output inhibit means for inhibiting an externally output signal from the sensitivity output means while the calibrating means performs a calibration operation.

9. The apparatus according to claim 1, wherein said calibrating means calibrates the sensitivity measuring means each time the sensitivity measuring apparatus is switched on.

10. The apparatus according to claim 1, further comprising a calibration result output means for outputting the result of a normal calibration or an abnormal calibration on the basis of the calibration result provided by the calibrating means.

11. The apparatus according to claim 1, further comprising a signal input inhibit means for inhibiting any external signal from being inputted to the sensitivity measuring apparatus while the calibrating means performs a calibration operation.

12. The apparatus according to claim 1, wherein said calibrating means calibrates the sensitivity measuring means every predetermined time period.

13. A sensitivity measuring apparatus which is connected to a fire detector for measuring the fire detector sensitivity, said sensitivity measuring apparatus comprising:

a sensitivity measuring means for receiving the output signal of the fire detector so as to measure the sensitivity of the fire detector; and a type identifying means for identifying the type of the fire detector on the basis of one of either an overall time when the output signal is output from the fire detector and a period of the output signal from the fire detector.

14. The apparatus according to claim 13, further comprising a type output means for outputting the type identified by the type identifying means.

15. The apparatus according to claim 14, wherein said type output means comprises a display means for displaying identified result.

16. The apparatus according to claim 14, wherein said type output means comprises a sound output means for outputting identified result by sound.

17. The apparatus according to claim 13, wherein said sensitivity measuring means comprises a plurality of sensitivity measuring portions corresponding to a plurality of types of fire detectors, and said apparatus comprises selecting means for selecting one of said plurality of sensitivity measuring portions corresponding to the type of the fire detector identified by the type identifying means.

18. A sensitivity measuring apparatus which is connected to a fire detector for measuring the fire detector sensitivity, said sensitivity measuring apparatus comprising:

a signal detecting means for detecting any one of a magnitude, frequency and signal output duration of an output signal from the fire detector;

a sensitivity measuring means for measuring the sensitivity of the fire detector on the basis of the signal output from an output terminal of the fire detector;

a clock signal supplying means for supplying a clock signal to the sensitivity measuring means; and a supply stop means for stopping the supply of the clock signal from the clock signal supplying means to the sensitivity measuring means when the signal detecting means detects an absence of an output signal from the fire detector during a predetermined time period.

19. The apparatus according to claim 18, further comprising a supply start means for starting the supply of the clock signal from the clock signal supplying means to the sensitivity measuring means when the signal detecting means detects the output signal of the fire detector.

20. The apparatus according to claim 19, wherein said sensitivity measuring means comprises:

an analog signal processing means for receiving and processing the analog signal output from the fire detector;

an A/D converter means for receiving and converting the analog signal processed by the analog signal processing means into a digital signal;

a digital signal processing means for receiving and processing the digital signal converted by the A/D converter means; and an output means for outputting a result processed by the digital signal processing means.

21. The apparatus according to claim 20, wherein said analog signal processing means performs at least one of the three functions of an impedance matching function for the signal, an amplifying function of the signal and a signal holding function.

22. A sensitivity measuring apparatus a fire detector for measuring the fire detector sensitivity, said sensitivity measuring apparatus comprising:

a signal detecting means for detecting any one of a magnitude, frequency and signal duration of an output signal from the fire detector;

a sensitivity measuring means for measuring the sensitivity of the fire detector on the basis of the signal detected by the signal detecting means;

a power supply means for supplying power to the sensitivity measuring means; and a supply stop means for stopping the supply of power from the power supply means to the sensitivity measuring means when the signal detecting means detects an absence of an output signal from the fire detector during a predetermined time period.

23. The apparatus according to claim 22, further comprising a supply start means for starting the supply of power from the power supply means to the sensitivity measuring means when the signal detecting means detects the output signal of the fire detector.

24. The apparatus according to claim 23, wherein said sensitivity measuring means comprises:

an analog signal processing means for receiving and processing the analog signal output from the fire detector;

an A/D converter means for receiving and converting the analog signal processed by the analog signal processing means into a digital signal;

a digital signal processing means for receiving and processing the digital signal converted by the A/D converter means; and an output means for outputting a result processed by the digital signal processing means.

25. The apparatus according to claim 24, wherein said analog signal processing means performs at least one of the three functions of an impedance matching function for the signal, an amplifying function of the signal and a signal holding function.

26. A sensitivity measuring apparatus which is connected to a fire detector for measuring the fire detector sensitivity, said sensitivity measuring apparatus comprising:

a measuring means for measuring an output signal from the fire detector to obtain measured data every predetermined time period;

an extracting means which extracts a second predetermined number of measured data from among a group of data consisting of a first predetermined number of measured data greater than the second predetermined number of measured data, in the order in which extracting priority is given over smaller mutual differences; and a mean-value calculating means for calculating a mean value of the measured data extracted by the extracting means, and a sensitivity determining means for determining the sensitivity of the fire detector on the basis of the mean value calculated by the mean-value calculating means.

27. The apparatus according to claim 26, wherein said extracting means updates said group of data by replacing the group's oldest measured data with newly obtained data each time the said measuring means measures the output signal from the fire detector.

28. A sensitivity measuring apparatus which is connected to a fire detector for measuring the fire detector sensitivity, said sensitivity measuring apparatus comprising:

a reference voltage generating circuit for generating a reference voltage for calibration;

an amplifier for amplifying an analog signal output from an output terminal of the fire detector;

a sample and hold circuit for sampling and holding the output from said amplifier;

an A/D converter for converting an analog signal output from said sample and hold circuit into a digital signal;

a first memory for storing a reference voltage generated from said reference voltage generating circuit;

a second memory for storing the amplification degree of said amplifier;

a first switching circuit for inputting the reference voltage generated from said reference voltage generating circuit into said A/D converter;

a second switching circuit for inputting the reference voltage generated from said reference voltage generating circuit into said sample and hold circuit;

a third switching circuit for inputting the reference voltage generated from said reference voltage generating circuit into said amplifier;

a first calculating circuit for comparing an output from said A/D converter with the reference voltage stored in said first memory when the reference voltage is input into said A/D converter through said first switching circuit and for calculating a first error correction coefficient so as to correct the output from said A/D converter to the reference voltage stored in said first memory when the output from said A/D converter differs from the reference voltage as a result of the comparison;

a second calculating circuit for comparing the output from said A/D converter with the reference voltage stored in said first memory when the reference voltage is input into said sample and hold circuit through said second switching circuit and for calculating a second error correction coefficient so as to correct the output from said A/D converter to the reference voltage stored in said first memory when the output from said A/D converter differs from the reference voltage as a result of the comparison;

a third calculating circuit for comparing the output from said A/D converter with the product of the reference voltage stored in said first memory and the amplification degree stored in said second memory when the reference voltage is input into said amplifier through said third switching circuit and for calculating a third error correction coefficient so as to correct the output from said A/D converter to the reference voltage stored in said first memory when the output from said A/D converter differs from the reference voltage as a result of the comparison;

a calibrating circuit for calibrating the output from said A/D converter by using at least the third error correction coefficient calculated by said third calculating circuit when said amplifier is connected to the output terminal of the fire detector to measure the sensitivity of the fire detector, and an output circuit for converting the output calibrated by said calibrating circuit into the sensitivity of the fire detector to output the converted sensitivity.

29. The apparatus according to claim 28, wherein said second calculating circuit calculates the second error correction coefficient by using the first error correction coefficient, said third calculating circuit calculating the third error correction coefficient by using the first and second error correction coefficients, said calibrating circuit calibrating the output from said A/D converter by using the first, second and third error correction coefficients, said output circuit including a third memory for storing a table between the output value and the sensitivity value of the fire detector and a forth calculating circuit for calculating the sensitivity value on the basis of the calibrated output by using the table stored in said third memory.

30. A sensitivity measuring apparatus which is connected to a fire detector for measuring the fire detector sensitivity, said sensitivity measuring apparatus comprising:

an amplifier to which an analog output port of the fire detector is connected;

a sample and hold circuit for sampling and holding the output from said amplifier;

an A/D converter for converting the output from said sample and hold circuit into a digital signal;

a switching circuit which is normally OFF for bypassing said amplifier and said sample hold circuit when in an ON state;

a signal distinguishing circuit to which an analog output port of the fire detector is connected for distinguishing whether the analog output from the fire detector is a pulse signal or a direct current signal; and a control circuit for turning said switching circuit ON when said signal distinguishing circuit distinguishes that the analog output from the fire detector is a pulse signal.

* * * * *